(12) United States Patent
Apanius et al.

(10) Patent No.: US 8,030,425 B2
(45) Date of Patent: Oct. 4, 2011

(54) PHOTOSENSITIVE COMPOSITIONS BASED ON POLYCYCLIC POLYMERS FOR LOW STRESS, HIGH TEMPERATURE FILMS

(75) Inventors: Christopher Apanius, Moreland Hills, OH (US); Matthew Apanius, Hudson, OH (US); Edmund Elce, Lakewood, OH (US); Hendra Ng, Highland Heights, OH (US); Brian Knapp, Medina, OH (US); Takashi Hirano, Tokyo (JP); Junya Kusunoki, Tokyo (JP); Robert Shick, Brecksville, OH (US)

(73) Assignee: Promerus LLC, Brecksville, OH (US)

( * ) Notice: Subject to any disclaimer, the term of this patent is extended or adjusted under 35 U.S.C. 154(b) by 319 days.

(21) Appl. No.: 12/327,611

(22) Filed: Dec. 3, 2008

(65) Prior Publication Data
US 2009/0189277 A1    Jul. 30, 2009

Related U.S. Application Data

(60) Continuation-in-part of application No. 11/324,738, filed on Jan. 3, 2006, which is a division of application No. 10/465,511, filed on Jun. 19, 2003, now Pat. No. 7,022,790, application No. 12/327,611, which is a continuation-in-part of application No. 11/105,494, filed on Apr. 14, 2005, now abandoned.

(60) Provisional application No. 60/393,726, filed on Jul. 3, 2002, provisional application No. 60/585,829, filed on Jul. 7, 2004.

(51) Int. Cl.
  *C08F 10/00* (2006.01)
  *C08F 36/00* (2006.01)
  *C08G 59/00* (2006.01)

(52) U.S. Cl. .................. 526/281; 526/283; 528/403
(58) Field of Classification Search .................. 526/281, 526/283; 528/403
See application file for complete search history.

(56) References Cited

U.S. PATENT DOCUMENTS
6,903,171 B2 * 6/2005 Rhodes et al. ................ 526/171
* cited by examiner

*Primary Examiner* — William Cheung
(74) *Attorney, Agent, or Firm* — Turocy & Watson, LLP

(57) ABSTRACT

Vinyl addition polymer compositions, methods for forming such compositions, methods for using such compositions to form microelectronic and optoelectronic devices are provided. The vinyl addition polymer encompassed by such compositions has a polymer backbone having two or more distinct types of repeat units derived from norbornene-type monomers independently selected from monomers of Formula I:

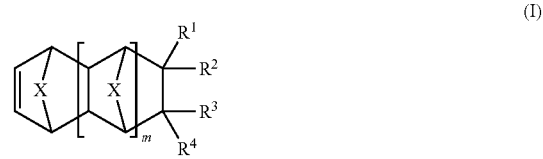

(I)

wherein each of X, m, $R^1$, $R^2$, $R^3$, and $R^4$ is as defined herein and wherein a first type of repeat unit is derived from a glycidyl ether substituted norbornene monomer and a second type of repeat unit is derived from an aralkyl substituted norbornene monomer.

42 Claims, 2 Drawing Sheets

FIG. 1

| Example/Additive | Ex. G | Ex. H | Ex. I | Ex. J |
|---|---|---|---|---|
| Rhodorsil PI 2074 | 2 phr | 2 phr | 2 phr | 2 phr |
| CPTX | 0.6 phr | 0.6 phr | 0.6 phr | 0.6 phr |
| Phenothiazine | 0.18 phr | 0.18 phr | 0.18 phr | 0.18 phr |
| Irganox 1076 | 1.5 phr | | 1.5 phr | |
| Irganox 1010 | | 5 phr | | 5 phr |
| Si-75 | | | 5 phr | 5 phr |

PHOTOSENSITIVE COMPOSITIONS BASED ON POLYCYCLIC POLYMERS FOR LOW STRESS, HIGH TEMPERATURE FILMS

CROSS-REFERENCE TO RELATED APPLICATIONS

This application is a Continuation-In-Part application of co-pending U.S. patent application Ser. No. 11/324,738 filed Jan. 3, 2006 now U.S. Patent Publication 20060167197, which is a Divisional application of co-pending U.S. patent application Ser. No. 10/465,511, filed Jun. 19, 2003 now U.S. Pat. No. 7,022,790, which claims the benefit of priority from U.S. Provisional Patent Application Ser. No. 60/393,726, filed Jul. 3, 2002, all three of which are incorporated herein by reference. This application is also a Continuation-In-Part application of co-pending U.S. patent application Ser. No. 11/105,494 filed Apr. 14, 2005 now abandoned now U.S. Patent Publication 20060020068, which claims the benefit of priority from U.S. patent application Ser. No. 10/465,511, filed Jun. 19, 2003 now U.S. Pat. No. 7,022,790 and U.S. Provisional Patent Application Ser. No. 60/585,829, filed Jul. 7, 2004, both of which are incorporated herein by reference.

BACKGROUND

1. Field of the Invention

The present invention relates to photosensitive polycyclic polymers, compositions thereof, films formed therefrom and processes for the use of such in microelectronic and optoelectronic devices, and more particularly to such polymers, compositions, films and processes where the polymer encompasses repeating units that result from the addition polymerization of functionalized norbornene-type monomers, where such films are characterized by, among other things, low internal stress and high temperature stability.

2. Description of Related Art

The rapid development of the microelectronics and optoelectronics industries has created a great demand for dielectric polymeric materials. At least in part, this demand is driven by these industries' advances toward devices that require such materials to achieve higher functionality and operational speeds than devices made in the past. For example, advanced microelectronic devices such as high density memories and microprocessors generally require several layers of closely spaced electrical interconnects that must be insulated from one another by a dielectric material with the lowest possible dielectric constant to reduce capacitive coupling effects.

While it has been shown that the dielectric constant of silicon dioxide can be reduced (from 3.9) by doping the oxide with fluorine and/or carbon, the reductions obtained are not large and often the resulting films pose reliability problems. Hence the aforementioned demand for dielectric polymeric materials that can provide larger dielectric constant reductions. However, despite the lower dielectric constants such materials offer, finding polymeric materials that are compatible with well established processing methods and that have appropriate mechanical, chemical and thermal properties, for example low internal stress and thermal stability, has been difficult. Despite this difficulty, efforts have continued to find appropriate materials as the potential uses for such polymeric materials has become apparent.

Thus unlike inorganic materials such as doped oxides, it has been found that a polymeric material with an appropriate modulus can enhance the reliability of packaged integrated circuits by acting as an interposer between circuit and package components with large differences in their coefficients of thermal expansion, thus preventing die cracking and the like. In addition to having an appropriate modulus, and particularly important for packaging applications that include thermal cycling such as a lead-free soldering process, it is desirable for such a polymeric material to also have low internal stress and good thermal stability. However, heretofore known polymers can often be difficult to pattern as the etch properties of polymers and the photoresist compositions used for patterning them are very similar. Accordingly, efforts to selectively remove portions of the polymer can be problematic and it has been known to form an interposing material between the polymer and the resist composition where such interposing material can be selectively patterned and such patterned interposer material used for defining a pattern in the underlying polymer material.

The additional steps required to form a hard mask are generally not cost effective and hence alternate methods for patterning low dielectric constant polymer materials that do not require such steps would be advantageous. To this effect, U.S. Pat. No. 6,121,340 discloses a negative-working photodefinable polymer composition comprising a photoinitiator and a polycyclic addition polymer comprising repeating units with pendant hydrolyzable functionalities (e.g., silyl ethers). Upon exposure to a radiation source, the photoinitiator catalyzes the hydrolysis of the hydrolyzable groups to effect selective crosslinking in the polymer backbone to form a pattern. Thus the dielectric material of the '340 patent is in and of itself photodefinable. However, the polymer compositions disclosed in the '340 patent disadvantageously require the presence of moisture for the hydrolysis reaction to proceed. Since the presence of such moisture in the dielectric layer can lead to reliability problems in completed microelectronic devices and packages thereof, the materials of the '340 patent are usefully directed to other applications.

Recently, Japanese Patent No. JP3588498 B2, entitled "EPDXIDIZED CYCLOOLEFIN-BASED RESIN COMPOSITION AND INSULATING MATERIAL USING THE SAME" issued to Nippon Zeon, Ltd. (NZ patent). The patent is directed to providing a thin film excellent in heat resistance, solvent resistance, low water absorption properties, electrical insulating properties, adhesive properties, chemical resistance and the like. To this effect, the patent discloses various polymeric compositions where the polymer employed in the composition encompasses epoxy functional groups that can be crosslinked to provide a stable polymer film having the aforementioned properties. To obtain such a polymer encompassing epoxy groups, the NZ patent teaches first forming a polymer without epoxy functional groups and then subsequently grafting, by a free radical method, such groups to the polymer backbone, that is to say providing epoxy functional groups to one or more of the repeat units that form the polymer backbone. The patent teaches that such grafting requires an appropriate unsaturated epoxy group containing monomer and a free radical initiator, for forming a free radical on the backbone for the unsaturated monomer. While such a grafting reaction can successfully provide a polymer encompassing epoxy functional groups, the grafting will problematically lead to the addition (grafting) of epoxy groups at any of several positions within the repeat units and backbone as determined by the differences in reactivity of the different types of carbons present (the order of reactivity being primary<secondary<tertiary), as well as other factors such as the steric environment about each potential addition site and the number of sites available for addition. Thus some of the polymer's repeat units may have multiple epoxy functional groups grafted thereto, while other repeat units will have none. Furthermore, once an epoxy group containing monomer has been grafted, the functional group itself can offer sites for grafting making the composition of the resulting polymer unpredictable (See, Huang, et. al., "Fundamental Studies of Grafting Reactions in Free Radical Copolymerization" J. Polymer Science, Part A 33, 2533-2549 (1995)). Given this unpredictability, it should be obvious that it would also be problematic to graft more than one type of functional group onto the polymer backbone such that a specific desired result is obtained, or to create a polymer having selected functional groups at predetermined positions on the polymer backbone such that the resulting polymer is tailored to a specific use or application.

As the skilled artisan knows, a photodefinable polymer must have an essentially uniform composition so that an imagewise exposure of the polymer will have essentially the same effect on all portions of the polymer that are exposed. Given the compositional unpredictability of the NZ polymer composition, both among the plurality of polymer chains and within the plurality of repeat units of any one polymer chain, it is believed that the polymers and polymer compositions disclosed by the NZ patent, other than perhaps homopolymers and compositions thereof, are unlikely to be suitable as a photodefinable composition for microelectronic applications. Furthermore, it should also be realized that in addition to being unsuitable as a photodefinable polymer or polymer composition, the NZ polymers will have unpredictable physical and mechanical properties as a result of their unpredictable and hence non-uniform structural composition. Thus where it is beneficial to have a polymer with a low modulus of a specific range of values, the unpredictability of structural composition of the polymer that is formed by such a grafting reaction makes it unlikely that a specific range of modulus values can be obtained at all or if obtained, reproduced. Thus as it is advantageous to have a polymer that can be tailored to meet the specific requirements of an application, the NZ polymer and polymer compositions are at best problematic.

Therefore, it would be desirable to provide low dielectric constant polymeric materials having an appropriate modulus for use in the microelectronic and optoelectronic industries. It would further be desirable if such polymeric materials are in and of themselves photodefinable, do not require the presence of moisture to be photodefined and which can be tailored to have specific values physical, mechanical and chemical properties, for example modulus, internal stress and thermal stability. In addition it would be desirable to provide methods to make such photodefinable materials for a variety of appropriate uses, for example to form low dielectric constant films and microelectronic and/or optoelectronic devices that employ such films. It would also be desirable for the methods provided to allow the resulting polymer to be readily tailored to a specific use or application.

BRIEF DESCRIPTION OF DRAWINGS

FIG. 1 depicts a Table describing amounts of additives to form polymer compositions G, H, I and J in Examples G, H, I and J.

DETAILED DESCRIPTION

Figure 2:
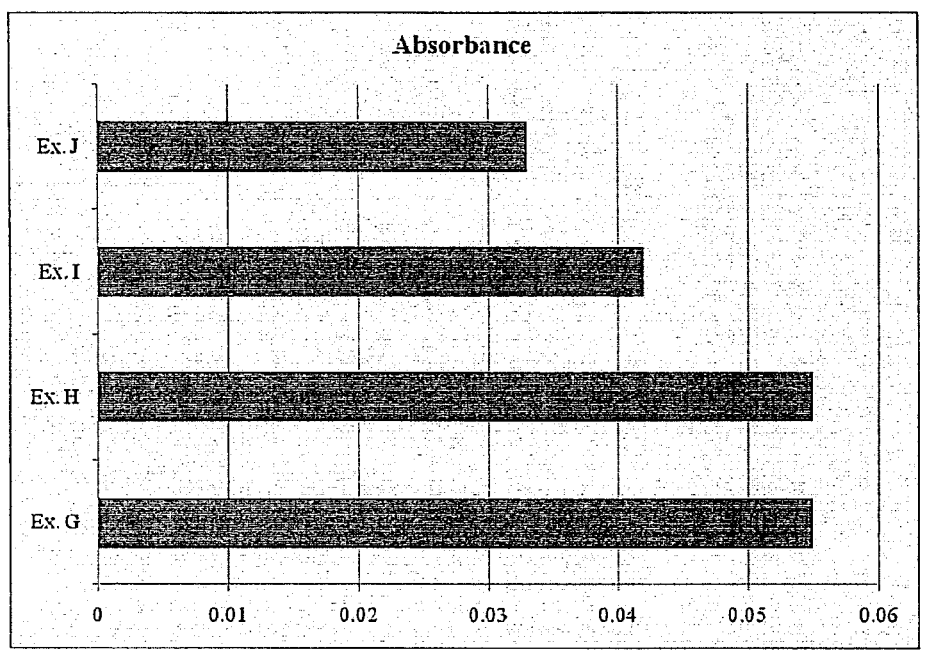
FIG. 2 depicts the result of an absorbance measurement.

Other than in the operating examples, or where otherwise indicated, all numbers, values and/or expressions referring to quantities of ingredients, reaction conditions, etc., used in the specification and claims are to be understood as modified in all instances by the term "about."

Various numerical ranges are disclosed in this patent application. Because these ranges are continuous, unless specifically noted otherwise, they include the minimum and maximum values of each range and every value therebetween. Furthermore, unless expressly indicated otherwise, the various numerical ranges specified in this specification and in the claims are approximations that are reflective of the various uncertainties of measurement encountered in obtaining such values.

Embodiments, in accordance with the present invention, provide polymers encompassing a vinyl addition polymer with a backbone having two or more distinct types of repeat units derived from norbornene-type monomers, such monomers being independently selected from monomers represented by structural Formula I below:

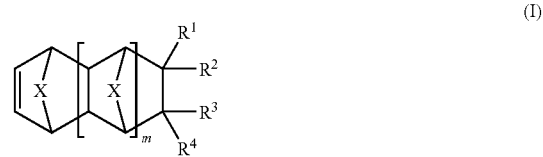

where a first distinct type of the repeat units encompasses at least one glycidyl ether functional pendant group and a second distinct type of the repeat units encompasses at least one aralkyl pendant group, and X, m, $R^1$, $R^2$, $R^3$, and $R^4$ are as defined below. The polymers of such embodiments can be used in polymer compositions for forming films having low internal stress, that are capable of being exposed to processing temperatures in excess of 300° C., that can be photodefined to form patterns in which the sidewall profile forms an angle less than vertical and where commercial developers, such as cyclopentanone and methyl n-amyl ketone (2-heptanone) ("MAK") can be employed in a photodefining process.

As used herein, when referring to "vinyl addition polymers" in accordance with Formula I, it will be understood that such polymers encompass a backbone having two or more distinct or different repeat units. For example a polymer having two or more distinct types of repeat units can have two, three, four or more distinct types of repeat units.

By the term "derived" is meant that the polymeric repeating units are polymerized (formed) from polycyclic norbornene-type monomers, in accordance with Formula I, wherein the resulting polymers are formed by 2,3 enchainment of norbornene-type monomers as shown below:

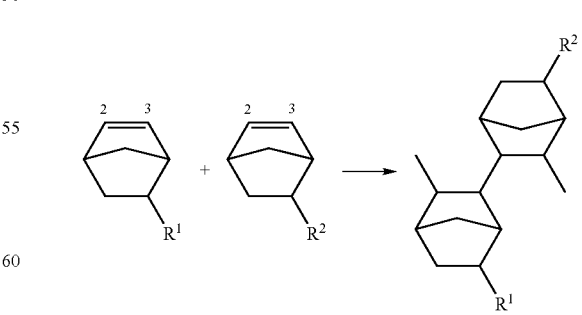

As used herein, the term "polymer" is meant to include a vinyl addition polymerized polymer as defined above, as well as residues from initiators, catalysts, and other elements attendant to the synthesis of such polymer, where such residues are understood as not being covalently incorporated thereto. Such residues and other elements are typically mixed or co-mingled with the polymer such that they tend to remain with the polymer when it is transferred between vessels or between solvent or dispersion media.

As used herein, the term "polymer composition" is meant to include the aforementioned polymer, as well as materials added after synthesis of the polymer. Such materials include, but are not limited to solvent(s), antioxidant(s), photoinitiator (s), sensitizers, synergist(s) and other materials as will be discussed more fully below.

As used herein, the term "low K" refers in general to a dielectric constant less than that of thermally formed silicon dioxide (3.9) and when used in reference to a "low-K material" it will be understood to mean a material having a dielectric constant of less than 3.9.

As used herein, the term "modulus" is understood to mean the ratio of stress to strain and unless otherwise indicated, refers to the Young's Modulus or Tensile Modulus measured in the linear elastic region of the stress-strain curve. Modulus values are generally measured in accordance with ASTM method D1708-95. Films having a low modulus are understood to also have low internal stress.

As used herein, the term "photodefinable" refers to the characteristic of a material or composition of materials, such as a polymer composition in accordance with embodiments of the present invention, to be formed into, in and of itself, a patterned layer or a structure. In alternate language, a "photodefinable layer" does not require the use of another material layer formed thereover, for example a photoresist layer, to form the aforementioned patterned layer or structure. It will be further understood that a polymer composition having such a characteristic be employed in a pattern forming scheme to form a patterned film/layer or structure. It will be noted that such a scheme incorporates an "imagewise exposure" of the photodefinable material or layer. Such imagewise exposure being taken to mean an exposure to actinic radiation of selected portions of the layer, where non-selected portions are protected from such exposure to actinic radiation.

As used herein, the phrase "a material that photonically forms a catalyst" refers to a material that, when exposed to "actinic radiation" will break down, decompose, or in some other way alter its molecular composition to form a compound capable of initiating a crosslinking reaction in the polymer, where the term "actinic radiation" is meant to include any type of radiation capable of causing the aforementioned change in molecular composition. For example, any wavelength of ultraviolet or visible radiation regardless of the source of such radiation or radiation from an appropriate X-ray or electron beam source. Non-limiting examples of suitable materials that "photonically form catalyst" include photoacid generators and photobase generators such as are discussed in detail below. It should also be noted that generally "a material that photonically forms a catalyst" will also form a catalyst if heated to an appropriate temperature.

The term "cure" (or "curing") as used in connection with a composition, e.g., "a cured composition," shall mean that at least a portion of the crosslinkable components which are encompassed by the composition are at least partially crosslinked. In some embodiments of the present invention, the crosslink density of such crosslinkable components, i.e., the degree of crosslinking, is essentially 100% of complete crosslinking. In other embodiments, the crosslink density ranges from 80% to 100% of complete crosslinking. One skilled in the art will understand that the presence and degree of crosslinking (crosslink density) can be determined by a variety of methods, such as dynamic mechanical thermal analysis (DMTA) as discussed below. This method determines the glass transition temperature and crosslink density of free films of coatings or polymers. These physical properties of a cured material are related to the structure of the crosslinked network. Higher crosslink density values indicate a higher degree of crosslinking in the coating or film.

As used above, and throughout the specification, the following terms, unless otherwise indicated, shall be understood to have the following meanings:

The statements below, wherein, for example, $R^{23}$ and $R^{24}$ are said to be independently selected from a group of substituents, means that $R^{23}$ and $R^{24}$ are independently selected, but also that where an $R^{23}$ variable occurs more than once in a molecule, those occurrences are independently selected (e.g., if $R^1$ and $R^2$ are each epoxy containing groups of structural formula II, $R^{23}$ can be H in $R^1$, and $R^{23}$ can be methyl in $R^2$). Those skilled in the art will recognize that the size and nature of the substituent(s) will affect the number of substituents that can be present.

It should be noted that any atom with unsatisfied valences in the text, schemes, examples and tables herein is assumed to have the hydrogen atom(s) to satisfy the valences.

By "hydrocarbyl" is meant that the substituent is hydrogen or is composed solely of carbon and hydrogen atoms. As one skilled in the art knows, hydrocarbyl is inclusive of the following where the definitions apply regardless of whether a term is used by itself or in combination with other terms, unless otherwise indicated. Therefore, the definition of "alkyl" applies to "alkyl" as well as the "alkyl" portions of "aralkyl", "alkaryl", etc.

As used herein, the term "alkyl" means an aliphatic hydrocarbon group that can be linear or branched acyclic or cyclic and comprises 1 to 25 carbon atoms in the chain. In one embodiment, useful alkyl groups comprise 1 to 12 carbon atoms in the chain. "Branched" means that one or more lower alkyl groups such as methyl, ethyl or propyl, are attached to a linear alkyl chain. The alkyl group can contain one or more heteroatoms selected from O, N and Si. Non-limiting examples of suitable alkyl groups include methyl, ethyl, n-propyl, isopropyl, n-butyl, t-butyl, n-pentyl, hexyl, heptyl, nonyl, decyl, cyclohexyl and cyclopropylmethyl.

"Aryl" means an aromatic monocyclic or multicyclic ring system comprising 5 to 14 carbon atoms, preferably 6 to 10 carbon atoms. The aryl group can contain one or more heteroatoms selected from O, N and Si. The aryl group can be substituted with one or more "ring system substituents" which may be the same or different, and include hydrocarbyl substituents. Non-limiting examples of suitable aryl groups include phenyl, naphthyl, indenyl, tetrahydronaphthyl and indanyl.

"Aralkyl" or "arylalkyl" means an aryl-alkyl-group in which both aryl and alkyl are as previously described. In some embodiments, useful aralkyls comprise a lower alkyl group. Non-limiting examples of such suitable aralkyl groups include benzyl, phenethyl and naphthlenylmethyl where the aralkyl is linked to the norbornene through the alkylene group. In some embodiments, the aralkyl group can contain one or more heteroatoms selected from O, N and Si.

"Cyclic alkyl" or cycloalkyl means a non-aromatic mono- or multicyclic ring system generally encompassing 3 to 10 carbon atoms, in some embodiments 5 to 10 carbon atoms and in other embodiments 5 to 7 carbon atoms. The cycloalkyl can be substituted with one or more "ring system substituents" which may be the same or different, and include hydrocarbyl or aryl substituents. Non-limiting examples of suitable monocyclic cycloalkyls include cyclopropyl, cyclobutyl, cyclopentyl, cyclohexyl and the like. Non-limiting examples of suitable multicyclic cycloalkyls include 1-decalinyl, norbornyl, adamantyl and the like. The cycloalkyl group can contain one or more heteroatoms selected from O, N and Si ("heterocyclyl"). Non-limiting examples of suitable monocyclic heterocyclyl rings include piperidyl, pyrrolidinyl, piperazinyl, morpholinyl, thiomorpholinyl, thiazolidinyl, 1,3-dioxolanyl, 1,4-dioxanyl, tetrahydrofuranyl, tetrahydrothiophenyl, tetrahydrothiopyranyl, and the like.

As previously mentioned, embodiments in accordance with the present invention are directed to polymer compositions encompassing a vinyl addition polymer that encompasses a backbone having two or more distinct types of repeat units derived from norbornene-type monomers, such monomers being independently selected from monomers in accordance with Formula I:

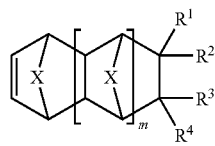

(I)

where X is selected from —$CH_2$—, —$CH_2$—$CH_2$— and —O—; m is an integer from 0 to 5, in some cases 0 to 3, and in other cases 0 to 2 and each occurrence of $R^1$, $R^2$, $R^3$, and $R^4$ is independently selected from one of the following groups:

H, $C_1$ to $C_{25}$ linear, branched, and cyclic alkyl, aryl, aralkyl, alkaryl, alkenyl, and alkynyl; or $C_1$ to $C_{25}$ linear, branched, and cyclic alkyl, aryl, aralkyl, alkaryl, alkenyl, and alkynyl containing one or more hetero atoms selected from O, N, and Si; or a glycidyl ether moiety in accordance with Formula II:

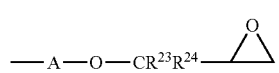

(II)

where A is a linking group selected from $C_1$ to $C_6$ linear, branched, and cyclic alkylene and $R^{23}$ and $R^{24}$ are each independently selected from H, methyl, and ethyl; or
any combination of two of $R^1$, $R^2$, $R^3$, and $R^4$ linked together by a linking group selected from $C_1$ to $C_{25}$ linear, branched, and cyclic alkylene and alkylene aryl.

with the proviso that one of the at least two distinct types of monomers in accordance with Formula I encompasses at least one glycidyl ether pendant group and another of the at least two distinct types of monomers encompasses at least one aralkyl pendant group.

Generally, the two or more distinct types of repeat units of embodiments in accordance with the present invention are derived from monomers in accordance with Formula I that include a glycidyl ether pendent group and an aralkyl pendent group. Some embodiments include repeat units derived from monomers having such aforementioned pendent groups in optional combination with one or more types of repeat units derived from hydrocarbyl substituted norbornene-type monomers.

Suitable monomers having a glycidyl ether pendent group are norbornene-type monomers represented by Formula I wherein one or more of $R^1$, $R^2$, $R^3$, and $R^4$ is independently a pendent group represented by Formula II:

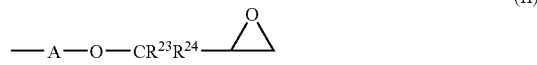

(II)

where A is a linking group selected from $C_1$ to $C_6$ linear, branched, and cyclic alkylene and $R^{23}$ and $R^{24}$ are each independently selected from H, methyl, and ethyl. Non-limiting examples of suitable linking groups A include methylene, ethylene, propylene, isopropylene, butylene, isobutylene and hexylene. Non-limiting examples of useful glycidyl alkyl ether pendent groups include glycidyl methyl ether, glycidyl ethyl ether, glycidyl propyl ether, glycidyl isopropyl ether, glycidyl butyl ether, glycidyl isobutyl ether, glycidyl hexyl ether and mixtures thereof.

Suitable monomers having an aralkyl pendent group are norbornene-type monomers represented by Formula I wherein one or more of $R^1$, $R^2$, $R^3$, and $R^4$ is an alkaryl group such as benzyl, phenethyl and naphthlenylmethyl phenethyl.

Suitable monomers having an optional hydrocarbyl pendent group are norbornene-type monomers represented by Formula I wherein one or more of $R^1$, $R^2$, $R^3$, and $R^4$ is each independently selected from hydrogen, linear and branched ($C_1$ to $C_{20}$)alkyl, hydrocarbyl substituted and unsubstituted ($C_5$ to $C_{12}$)cycloalkyl, hydrocarbyl substituted and unsubstituted ($C_6$ to $C_{40}$)aryl, hydrocarbyl substituted and unsubstituted ($C_7$ to $C_{15}$)aralkyl, ($C_3$ to $C_{20}$)alkynyl, linear and branched ($C_3$ to $C_{20}$)alkenyl or vinyl; any of $R^1$ and $R^2$ or $R^3$ and $R^4$ can be taken together to form a ($C_1$ to $C_{10}$)alkylidenyl group, $R^2$ and $R^4$ when taken with the two ring carbon atoms to which they are attached can represent saturated or unsaturated cyclic groups containing 4 to 12 carbon atoms or an aryl ring containing 6 to 17 carbon atoms; and m is 0, 1, 2, 3, 4 or 5.

In some embodiments, when m is zero, monomers in accordance with Formula (I) are represented by Formula (III) below:

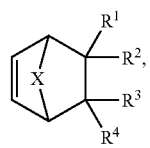

(III)

where X, $R^1$, $R^2$, $R^3$, and $R^4$ are as discussed above.

In some embodiments of the present invention, a first type of distinct repeat unit is derived from a norbornene-type monomer where X is —$CH_2$—, m is zero, three of the groups $R^1$, $R^2$, $R^2$ and $R^4$ are each H and the fourth is a glycidyl ether containing group in accordance with Formula II in which A is alkylene and $R^{23}$ and $R^{24}$ are each H. Exemplary monomers include, but are not limited to glycidyl alkyl ether norbornene-type monomers, such as glycidyl methyl ether norbornene, glycidyl ethyl ether norbornene, glycidyl propyl ether norbornene, glycidyl isopropyl ether norbornene, glycidyl butyl ether norbornene, glycidyl isobutyl ether norbornene, and/or glycidyl hexyl ether norbornene.

In some embodiments, a second type of distinct repeat unit is derived from a norbornene-type monomer where X is —$CH_2$—, m is zero, three of the groups $R^1$, $R^2$, $R^2$ and $R^4$ are each H and the fourth is an aralkyl group. Exemplary aralkyl groups include, but are not limited to, groups such as benzyl, phenethyl, phenpropyl, naphthlenylmethyl phenethyl and the like.

In some embodiments, a third type of distinct repeat unit is derived from a norbornene-type monomer where X is —CH$_2$—, m is zero, three of the groups R$^1$, R$^2$, R$^2$ and R$^4$ are each H and the fourth is a linear or branched alkyl group. Non-limiting examples of such linear or branched alkyl groups include n-butyl, neopentyl, hexyl, decyl or dodecyl.

In an exemplary embodiment in accordance with the present invention, the first distinct type of repeat unit is derived from monomers containing at least one glycidyl methyl ether pendant group and the second distinct type of repeat unit is derived from monomers containing at least one phenethyl pendant group. The amount of the first distinct type of repeat unit encompassed in the polymer can range from 10 to 50 mole percent (mol %) on a basis of total mole percent of the monomers used to prepare the polymer, where the second distinct type of repeat unit encompasses the remainder of the total amount of repeat units in the polymer. In other embodiments, the amount of the first distinct type of repeat unit can range from 20 to 40 mol % on a basis of total mole percent of the monomers used to prepare the polymer, where again the second distinct type of repeat unit encompasses the remainder of the total amount of repeat units in the polymer.

In another exemplary embodiment of the present invention, the first distinct type of repeat unit is derived from monomers containing at least one glycidyl methyl ether pendant group, the second distinct type of repeat unit is derived from monomers containing at least one phenethyl pendant group and a third distinct type of repeat unit is derived from monomers containing at least one decyl group. The amount of the first distinct type of repeat unit encompassed in the polymer can range from 10 to 50 mol %, the amount of the second distinct type of repeat unit encompassed in the polymer can range from 5 to 50 mol %, and the amount of the third distinct type of repeat unit encompassed in the polymer can range from 15 to 75 mol %, on a basis of total mole percent of the monomers used to prepare the polymer.

In other embodiments, the polymer is prepared from 20-40 mol % of glycidyl methyl ether norbornene (GME NB) and 60-80 mol % of phenethyl norbornene (PE NB) and decyl norbornene (Decyl NB) taken together. In one such exemplary embodiment, 25-35 mol % of the polymer's repeat units are derived from GME NB, 35-45 mol % from PE NB and 25-35 mol % from Decyl NB, while in another exemplary embodiment, 25-35 mol % of the polymer's repeat units are derived from GME NB, 15-25 mol % from PE NB and 40-60 mol % from Decyl NB.

Advantageously, polymer embodiments in accordance with embodiments of the present invention each encompass an appropriate mol % of repeat units selected to provide the polymer with appropriate properties. For example, having repeat units that encompass a glycidyl ether pendent group(s), which when suitably catalyzed crosslink with other glycidyl ether pendent groups, advantageously results in crosslinked polymer portions that are resistant to being dissolved in some solvents. In this manner, a means for forming a pattern is provided where a polymer film is imagewise exposed to activating radiation and non-exposed, non-crosslinked polymer portions are removed by being dissolved in an appropriate solvent. As will be discussed in more detail below, having an appropriate mol % of a repeat unit that encompasses an aralkyl pendant group(s), such as a phenethyl pendant group, provides, among other things, a means for controlling the slope from vertical of the sidewalls of imaged portions of a photodefined polymer layer after appropriate curing. Also advantageous is having an appropriate mol % of repeat units that encompass an alykyl pendent group such as a decyl pendent group. Such repeat units provide a means for tailoring the modulus and internal stress of the final polymer film. It should be noted, that the advantages of the several types of repeat units, discussed briefly above, are non-limiting examples and that the exemplary repeat units can have other advantages and that other types of repeat units can have similar or other advantages.

Generally the monomers are polymerized in solution in the presence of an appropriate polymerization catalyst. Vinyl addition catalysts useful in preparing polymers in accordance with embodiments of the present invention have recently become known and include, for example, such catalysts represented by the formula: E$_{n'}$Ni(C$_6$F$_5$)$_2$ where n' is 1 or 2 and E represents a neutral 2 electron donor ligand. When n' is 1, E preferably is a n-arene ligand such as toluene, benzene, and mesitylene. When n' is 2, E is preferably selected from diethyl ether, THF (tetrahydrofuran), ethyl acetate, and dioxane. The ratio of monomer to catalyst in the reaction medium can range from 5000:1 to 50:1 in an exemplary embodiment of the invention, and in another exemplary embodiment can range from a ratio of 2000:1 to 100:1. The polymerization is generally conducted in a suitable solvent at an appropriate temperature in the range from 0° C. to 70° C., although other temperatures lower or high can also be appropriate. In some embodiments, the temperature can range from 10° C. to 50° C., and in other embodiments from 20° C. to 40° C. Polymerization catalysts of the above formula that can be used to make polymers in accordance with embodiments of the present invention include, but are not limited to, (toluene)bis(perfluorophenyl) nickel, (mesitylene)bis(perfluorophenyl) nickel, (benzene)bis(perfluorophenyl) nickel, bis(tetrahydrofuran) bis(perfluorophenyl) nickel, bis(ethylacetate)bis(perfluorophenyl) nickel, and bis(dioxane)bis(perfluorophenyl) nickel. Other useful vinyl-addition catalysts include nickel and palladium compounds as disclosed in PCT WO 97/33198 and PCT WO 00/20472.

Suitable solvents used for the vinyl addition polymerization of monomers in accordance with the present invention include, but are not limited to, hydrocarbon and aromatic solvents. Hydrocarbon solvents useful in the invention include, but are not limited to, to alkanes and cycloalkanes such as pentane, hexane, heptane, and cyclohexane. Non-limiting examples of aromatic solvents include benzene, 1,2-dichlorobenzene, toluene, xylene, and mesitylene. Other organic solvents such as diethyl ether, tetrahydrofuran, acetates, e.g., ethyl acetate, esters, lactones, ketones, amides, and methylene chloride are also useful. Mixtures of one or more of the foregoing solvents can be utilized as a polymerization solvent.

Advantageously, the average molecular weight (Mw) of the polymer resulting from a polymerization in accordance with the present invention can be readily controlled. In some embodiments, such control is effected by changing the monomer to catalyst ratio. For example, all other things being the same, a polymerization using a monomer to catalyst ratio of 5000:1 will have a higher Mw then where the ratio is 100:1. In addition, polymers having a controllable Mw can also be formed, typically in the range from 10,000 to 500,000, by carrying out the polymerization in the presence of a chain transfer agent (CTA), where such a CTA is a compound having a terminal olefinic double bond between adjacent carbon atoms, wherein at least one of the adjacent carbon atoms has two hydrogen atoms attached thereto.

Some useful CTA compounds are represented by the Formula IV:

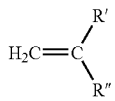

where R' and R" are each independently selected from hydrogen, branched or unbranched ($C_1$ to $C_{40}$) alkyl, branched or unbranched ($C_2$ to $C_o$) alkenyl, or halogen. Of the above chain transfer agents the α-olefins having 2 to 10 carbon atoms are preferred, e.g., ethylene, propylene, 4-methyl-1-pentene, 1-hexene, 1-decene, 1,7-octadiene, and 1,6-octadiene, or isobutylene.

While the optimum conditions for employing a CTA to obtain a specific result can be experimentally determined by a skilled artisan, we have learned that, in general, α-olefins (e.g., ethylene, propylene, 1-hexene, 1-decene, 4-methyl-1-pentene) are the most effective CTA's with 1,1-disubstituted olefins (e.g., isobutylene) being less efficient. In other words, all other things being equal, the concentration of isobutylene required to achieve a given molecular weight will be much higher than if ethylene were chosen.

It should be noted that methods of forming the polymer embodiments of the present invention provide a significant advantage over methods taught in previously mentioned Japanese Patent No. JP3588498 B2 (NZ patent). For example, the NZ patent teaches that providing an epoxy-containing pendent group requires that such a pendent group is grafted to the polymer by a free radical reaction. One disadvantage of such a method is that such a free radical graft reaction will result in a polymer having a non-uniform distribution of epoxy functional groups in the polymer backbone as the epoxy-containing monomer to be grafted can add at any of the one or more reactive sites within each repeat unit. Thus while some of the polymer's repeat units might have a single epoxy-group containing pendent group appended thereto as a result of the grafting, the position within each repeat unit where the pendent group is attached will vary among the number of available addition sites. Where only one position within the repeat unit is most desirable, it then follows that only a portion of the polymer will have attachment at that desirable position. Furthermore, some repeat units may have multiple epoxy functional groups grafted thereto, while other repeat units may have no grafted epoxy functional groups thus creating even greater variability in the product obtained. Also, once an epoxy group containing monomer has been grafted, the functional group itself can offer sites for additional grafting making it virtually impossible to predict the composition of the polymer that will be obtained from such a process. In addition to this unpredictability, since the NZ patent teaches that for such a free radical reaction to occur, the epoxy-containing moiety to be grafted must have an unsaturation to provide the electrons needed to form a covalent bond between the moiety and the carbon atom of the polymer to which such moiety is to be attached, some desirable polymer products are impossible to obtain by the NZ patent process. For example, there is no monomer precursor that can be employed to form a polymer that encompasses a glycidyl methyl ether pendent group by using the teaching of the NZ patent. In contrast, embodiments in accordance with the present invention include repeat units having such a glycidyl methyl ether pendent group as well as providing for having repeat units with such an epoxy containing pendent group where the position of such pendent group is known and essentially randomly dispersed along the polymer backbone.

As previously mentioned, polymer embodiments in accordance with the present invention have excellent physical properties, particularly for use in photodefinable compositions for electrical or electronic devices. Such properties include, but are not limited to, low moisture absorption (less than 2 weight percent), low dielectric constant (less than 3.9), low modulus (less than 3 GigaPascal (GPa)), cure temperatures compatible with the processing of electronic and optoelectronic devices and solubility of non-crosslinked polymers, or non-crosslinked portions of polymer films, in many common organic solvents which include common photolithographic developers.

In some embodiments of the present invention, the polymer composition encompasses a low K polymer, that is to say a cured polymer, film, layer or structure having a dielectric constant of less than 3.9 that is formed by means of photodefining such polymer. In some embodiments, such cured polymer, film, layer or structure can have a dielectric constant as low as 2.5, in some cases 2.3, and in other cases 2.2. It will be understood that a dielectric constant in the above range is sufficiently low to provide reduction of transmission delays and alleviation of crosstalk between conductive lines in electrical and/or electronic devices. The dielectric constant of the polymer, the polymer composition, photodefinable polymer compositions containing the polymer composition, and/or cured layers and/or films derived from such photodefinable polymer compositions can vary between any of the values recited above.

Embodiments in accordance with the present invention advantageously have a low modulus. Thus some embodiments of cured polymers, films, layers or structures in accordance with the present invention have a modulus less than 3.0 GPa and as low as 0.3 GPa, others as low as 0.2 GPa, and still others as low as 0.1 GPa. As a skilled artisan knows, if the modulus is too high, such a high modulus film will generally also have high internal stress which can lead to reliability issues, e.g., die cracking in an electronics package.

In other exemplary embodiments of cured polymers, films, layers or structures, such exhibit a level of moisture absorption of less than 2 weight percent, in some cases less than 0.8 weight percent, and in other cases less than 0.3 weight percent. As used herein, "moisture absorption" is determined by measuring weight gain of a sample in accordance with ASTM D570-98.

The cured polymers, films, layers or structures in accordance with the present invention advantageously have a glass transition temperature (Tg) from at least 170° C., in some cases at least 200° C., and in some cases at least 220° C. to as high as 350° C. In some embodiments Tg is as high as 325° C., in other embodiments as high as 300° C., and in some embodiments as high as 280° C. Advantageously, such high $T_g$ allows for the use of the cured polymers, films, layers or structures in a wide variety of applications and devices. As a non-limiting example, a Tg at or above 300° C. and in some cases at or above 350° C. is sufficient to allow for successful solder reflow processing during such as is used for the packaging of microelectronic devices such as ICs. The glass transition temperature of the polymer can vary between any of the values indicated above. As referred to herein, Tg is determined using Dynamic Mechanical Analysis (DMA) on a Rheometric Scientific Dynamic Analyzer Model RDAII available from TA Instruments, New Castle, Del. according to ASTM D5026-95 (temperature: ambient to 400° C. at a rate of 5° C. per minute).

As previously mentioned, polymers in accordance with the present invention have a weight average molecular weight (Mw) of from 10,000 to 500,000. For some embodiments of the present invention, it is advantageous to have a Mw of from at least 30,000, for others from at least 60,000 and in still others from at least 90,000. It is also advantageous for some such embodiments to limit the upper range of Mw to up to 400,000, in others to up to 250,000 and in still others to up to 140,000, where Mw is determined by gel permeation chromatography (GPC) using poly(styrene) standards. It will be understood that the Mw selected of a polymer of any embodiment in accordance with the present invention will be so selected to be sufficient to provide the desired physical properties in the cured polymer, films, layers or structures derived therefrom. In addition, it will be understood that the Mw of the polymer incorporated within such embodiments can vary between any of the Mw values provided above.

Polymer embodiments in accordance with the present invention are present in photodefinable polymer composition embodiments at a level sufficient to provide the above-described desired physical properties to the resulting composition, as well as coated layers and cured layers formed from such compositions. In exemplary photodefinable polymer composition embodiments of the present invention, the polymer is advantageously present in an amount of at least 10 wt %, in others at least 15 wt %, and in still others at least 25 wt % of the photodefinable polymer composition. It is also advantageous for some such composition embodiments to limit the upper range of polymer to an amount of up to 60 wt %, in others up to 50 wt %, and in still others up to 40 wt % of the photodefinable polymer composition. The amount of the polymer present in the photodefinable polymer composition can vary between any of the values recited above where such amount is selected based on the requirement of the specific application and the method by which the polymer composition is to be applied to a substrate.

Polymer composition embodiments in accordance with the present invention also encompass an appropriate solvent or solvent composition selected from reactive and non-reactive compounds. Such a solvent can be one or more of hydrocarbon solvents, aromatic solvents, cycloaliphatic cyclic ethers, cyclic ethers, acetates, esters, lactones, ketones, amides, aliphatic mono- and multivinyl ethers, cycloaliphatic mono- and multivinyl ethers, aromatic mono- and multivinyl ethers, cyclic carbonates, and mixtures thereof. Particular non-limiting examples of solvents that can be used include cyclohexane, benzene, toluene, xylene, mesitylene, tetrahydrofuran, anisole, terpenenoids, cyclohexene oxide, α-pinene oxide, 2,2'-[methylenebis(4,1-phenyleneoxymethylene)]bis-oxirane, 1,4-cyclohexanedimethanol divinyl ether, bis(4-vinyloxyphenyl)methane, cyclohexanone, 2-heptanone (MAK).

Such polymer composition embodiments of the present invention also generally encompass a material that photonically forms a catalyst, where the catalyst formed serves to initiate crosslinking of the polymer. Suitable materials that photonically form a catalyst include, but are not limited to, photoacid generators and photobase generators.

Where such a polymer composition encompasses a material that photonically forms a catalyst, such compositions can be directly photodefinable compositions in that where a layer of such a composition is imagewise exposed to appropriate actinic radiation, the catalyst is formed only in those portions of the film exposed to such radiation. Such photodefinable embodiments are negative-working photosensitive polymer compositions useful in a wide variety of electronic and optoelectronic applications. Some non-limiting examples of such applications include passivation layers having openings formed therein, buffering structures formed from a buffer layer for use in the assembly of multichip modules or high density interconnect micro-via substrates. Further to such exemplary embodiments, the photodefinable polymer composition that can be applied and patterned to form a dielectric layer or structure for the packaging of integrated circuits to protect against environmental and mechanical stresses. Additionally, such embodiments are useful as redistribution layers, passivation layers, and stress buffer materials for conventional, chip scale, and wafer level packaging of logic devices such as microprocessors, Application Specific Integrated Circuits (ASICs), discrete, memory, and passive devices as well as a variety of display devices and other optoelectronic devices that would benefit from such a layer. Thus, the photodefinable polymer compositions can be used in the fabrication of any of a wide variety of microelectronic, electronic or optoelectronic devices that would benefit from the incorporate of such a photodefinable polymer composition as a layer, film or structure.

When a photoacid generator is incorporated into a polymer composition of the present invention as the material that photonically forms a catalyst, the photoacid generator can include one or more compounds selected from onium salts, halogen-containing compounds, and sulfonates. Non-limiting examples of appropriate photoacid generators useful in embodiments of the present invention, include one or more compounds selected from 4,4'-ditertiarybutylphenyl iodonium triflate; 4,4',4"-tris(tertiary butylphenyl)sulphonium triflate; diphenyliodonium tetrakis(pentafluorophenyl)sulphonium borate; triarylsulphonium-tetrakis(pentafluorophenyl)-borate; triphenylsulfonium tetrakis(pentafluorophenyl) sulphonium borate; 4,4'-ditertiarybutylphenyl iodonium tetrakis(pentafluorophenyl) borate; tris(tertiary butylphenyl) sulphonium tetrakis(pentafluorophenyl) borate, and 4-methylphenyl-4-(1-methylethyl)phenyl iodonium tetrakis(pentafluorophenyl) borate.

Such photoacid generators are typically present at a level sufficient to promote or induce curing and crosslinking. For some embodiments in accordance with the present invention, such sufficient level is from at least 0.5 percent by weight (wt %) up to 10 wt %. In other embodiments a lower limit of from at least 0.75 wt % is appropriate and in still others from at least 1 wt % of the photodefinable polymer composition is appropriate. The amount of photoacid generator present in embodiments of the present invention can vary between any of the values recited above.

It will be understood that exemplary embodiments of the present invention can include other suitable components and/or materials such as are necessary for formulating and using the photodefinable polymer compositions in accordance with the present invention. Such other suitable components and/or materials include one or more components selected from sensitizer components, solvents, catalyst scavengers, adhesion promoters, antioxidants, synergists and the like.

Where appropriate, one or more sensitizer components can be included in photodefinable polymer composition embodiments of the present invention. Generally, sensitizers are employed to allow for a specific type or wavelength of radiation to cause the photoacid or photobase generator to become effective for initiating crosslinking in the polymer included therein. Such suitable sensitizer components include, but are not limited to, anthracenes, phenanthrenes, chrysenes, benzpyrenes, fluoranthenes, rubrenes, pyrenes, xanthones, indanthrenes, thioxanthen-9-ones, and mixtures thereof. In some exemplary embodiments, suitable sensitizer components include 2-isopropyl-9H-thioxanthen-9-one, 4-isopropyl-9H-thioxanthen-9-one, 1-chloro-4-propoxythioxanthone, phenothiazine and mixtures thereof.

In exemplary embodiments of the present invention having both a material that photonically forms a catalyst and a sensitizer component, the latter can be present in the photodefinable polymer composition in an amount from at least 0.1 wt % to as much as 10 wt % of the composition. In other embodiments a lower limit from at least 0.5 wt % is appropriate, and in still others from at least 1 wt % of the photodefinable polymer composition. The amount of sensitizer component present in the photodefinable polymer composition in this exemplary embodiment can vary between any of the values recited above.

In some embodiments according to the present invention, a catalyst scavenger is incorporated into the photodefinable polymer composition. Useful scavengers include acid scavengers and/or base scavengers. A non-limiting example of a suitable base scavenger that can be used in the present invention is trifluoro methylsulfonamide. Non-limiting examples of acid scavengers that can be used in the present invention include secondary amines and/or tertiary amines such as those selected from pyridine, phenothiazine, N-methylphenothiazine, tri(n-propyl amine), triethylamine, and lutidine in any of its isomeric forms.

In exemplary embodiments of the present invention having both a material that photonically forms a catalyst and a catalyst scavenger, the latter can be present in the photodefinable polymer composition in an amount from at least 0.01 wt % to as much as 5 wt % of the composition. In other embodiments a lower limit from at least 0.1 wt % is appropriate, and in still others from at least 0.25 wt % of the photodefinable polymer composition. The amount of catalyst scavenger present in the photodefinable polymer composition in this exemplary embodiment can vary between any of the values recited above.

In exemplary embodiments of the present invention, the solvent includes suitable reactive and/or non-reactive compounds such as are discussed in detail below.

In exemplary embodiments in accordance with the present invention, the solvent is present in the photodefinable polymer composition in an amount from at least 20 wt % to as much as 95 wt % of the composition. In other embodiments a lower limit from at least 35 wt % is appropriate and in still others from at least 50 wt % of the composition. The amount of solvent present in such photodefinable polymer composition embodiments can vary between any of the values recited above such that the embodiment's properties are appropriate for the method selected for coating a substrate therewith and for providing a layer having an appropriate thickness thereof. Non-limiting examples of such properties include viscosity and the evaporation rate of the solvent.

Any suitable reactive diluent or solvent can be used in the present invention. Suitable reactive diluents improve one or more of the physical properties of the photodefinable polymer composition and/or coating layers formed from the photodefinable polymer composition. In some exemplary embodiments, the reactive diluents include one or more compounds selected from epoxides and compounds described by structural units VI and VII:

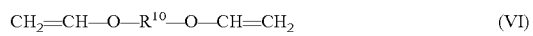

$$CH_2=CH-O-R^{10}-O-CH=CH_2 \quad (VI)$$

$$CH_2=CH-O-R^{11} \quad (VII)$$

where $R^{10}$ is a linking group selected from $C_1$ to $C_{20}$ linear, branched, and cyclic alkyl, alkylene, arylene and alkylene aryl, alkylene oxide containing from 2 to 6 carbon atoms, poly(alkylene oxide), wherein the alkylene portion of the repeat groups contain from 2 to 6 carbon atoms and the poly(alkylene oxide) has a molecular weight of from 50 to 1,000, $-[-R^{13}-N-C(O)-O-]_m-R^{13}-$, wherein each occurrence of $R^{13}$ is independently selected from $C_1$ to $C_{20}$ linear, branched, and cyclic alkylene, arylene, and alkylene aryl, and m is an integer of from 1 to 20; and $R^{11}$ is selected from $C_1$ to $C_{20}$ linear and branched, alkyl, and alkylol.

In further exemplary embodiments, the reactive diluents include one or more reactive diluents selected from phenyl vinyl ether, 1,4-butanediol divinyl ether, 1,6-hexanediol divinyl ether, 1,8-octanediol divinyl ether, 1,4-dimethanolcyclohexane divinyl ether, 1,2-ethylene glycol divinyl ether, 1,3-propylene glycol divinyl ether, ethyl vinyl ether, propyl vinyl ether, butyl vinyl ether, isobutyl vinyl ether, cyclohexyl vinyl ether, octyl vinyl ether, decyl vinyl ether, dodecyl vinyl ether, octadecyl vinyl ether, 1,4-butanediol vinyl ether, 1,6-hexanediol vinyl ether, and 1,8-octanediol vinyl ether.

Where an embodiment in accordance with the present invention employs such a reactive diluent, such is generally present in an amount from at least 0.5 wt % to 95 wt %. In some such embodiments it is advantageous for the lower limit to be from at least 3 wt %, in still others from at least 7.5 wt %. The reactive diluent is present in an amount sufficient to provide, among other things, desired physical properties to the photodefinable polymer composition and films or layers layers formed therefrom. Also, the reactive diluent is present in the photodefinable polymer composition in an amount of up to 95 percent by weight, in some cases up to 60 percent by weight, in other cases up to 30 percent by weight, and in some situations as little as 1 percent by weight of the photodefinable polymer composition. The amount of reactive diluent present in the photodefinable polymer composition in this exemplary embodiment can vary between any of the values recited above.

The photodefinable polymer composition embodiments of the present invention that encompass a solvent and/or a reactive diluent. are typically in liquid form at ambient temperatures, and have appropriate amounts of polymer, solvent and/or reactive diluent to provide a solution viscosity in the range of from at least 10 centipoise (cps) to up to 25,000 cps. Such solution viscosity is generally determined at 25° C. using an appropriately selected spindle mounted to a Brookfield DV-E viscometer, available from Brookfield Engineering Laboratories, Middleboro, Mass. It will be noted that the solution viscosity of embodiments in accordance with the present invention is a characteristic that is controlled by varying the concentrations of the several components of such compositions, such components including, but not limited to the aforementioned polymer, solvent and/or reactive diluent. Further, selecting a suitable solution viscosity is a function of, at least, the method to be used for coating the substrate with the polymer composition and the thickness of the resulting layer/film that is desired. Thus while a broad range of solution viscosity is provided above, it will be understood that the specific solution viscosity of a specific polymer composition embodiment can have any value that is appropriate for providing the desired layer thickness using the coating method selected.

Any suitable adhesion promoter can be used in the present invention. Suitable adhesion promoters improve the bond strength between a coated layer of photodefinable polymer composition and the substrate upon which it is coated. In an exemplary embodiment of the present invention, the adhesion promoter includes one or more compounds selected from 3-glycidoxypropyltrimethoxysilane (KBM-403E) (CAS# 2530-83-8) (Shin-Etsu Co. Ltd.), 3-glycidoxypropyltriethoxysilane, 3-aminopropyl triethoxysilane and compounds described by Formula V:

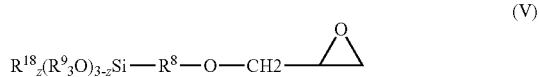

(V)

wherein z is 0, 1, or 2; $R^8$ is a linking group selected from $C_1$ to $C_{20}$ linear, branched, and cyclic alkylene, alkylene oxide containing from 2 to 6 carbon atoms, and poly(alkylene oxide), wherein the alkylene portion of the repeat groups contains from 2 to 6 carbon atoms and the poly(alkylene oxide) has a molecular weight of from 50 to 1,000; each occurrence of $R^9$ is independently selected from $C_1$ to $C_4$ linear and branched alkyl; and each occurrence of $R^{18}$ is selected from H and $C_1$ to $C_4$ linear and branched alkyl. Other adhesion promoters that are suitable for embodiments in accordance with the present invention include, among others, Si75 (bis(3,3'-triethoxysilylpropyl)disulfide, Si266 (bis[3-(triethoxysilyl)propyl]disulfide) (Si75 and Si266 are available from Evonik, Parsippany, N.J., USA), SIB1824.6 (bis[3-(triethoxysilyl)propyl]disulfide available from Gelest, Morrisville, Pa., USA), NXT*Z100 (Trade Secret organoalkoxysilane), NXT*Z45 (Trade Secret organoalkoxysilane), and Silquest A-1891 (CAS# 14814-09-6, this and the two NXT materials are available from Momentive Performance Materials, Friendly, W. Va., USA). It should be realized that each of the exemplary adhesion promoters listed above is generally designed to provide enhanced adhesion to a specific type of substrate material or layer overlying a substrate. Therefore, selection of a specific adhesion promoter for a polymer composition embodiment of the present invention generally reflects the nature of the substrate to which the composition will be applied.

In some embodiments according to the present invention, an antioxidant is incorporated into the photodefinable polymer composition. Exemplary antioxidant include, but are not limited to, Igafos® 168 (CAS# 31570-04-4 tris(2,4-ditert-butylphenyl) phosphite), Irganox® 1035 (CAS# 41484-35-9, thiodiethylene bis[3-(3,5-di-tert-butyl-4-hydroxyphenyl) propionate]), Irganox® 1076 (CAS# 2082-79-3, octadecyl 3,5-Di-(tert)-butyl-4-hydroxyhydrocinnamate), Irganox® 259 (CAS# 35074-77-2, 1,6-Hexanediolbis[3-3,5-di-tert-butyl-4-hydroxyphenyl)propionate]), Irganox® 1010 (CAS# 6683-19-8, pentaerythritol tetrakis(3-(3,5-di-tert-butyl-4-hydroxyphenyl)propionate), Irganox® 3125 (CAS# 34137-09-02, 3,5-Di-t-butyl-4-hydroxyhydrocinnamic acid triester with 1,3,5-tris(2-hydroxyethyl)-s-triazine-2,4,6(1H,3H.5H)-trione) and Irganox® 129 (CAS# 35958-30-6, 2,2'-Ethylidenebis (4,6-di-tert-butylphenol), all of which are available from Ciba Specialty Chemicals. It should be noted that antioxidant additives are employed in polymer compositions to improve the oxidative stability of the composition.

In some embodiments according to the present invention, a synergist is incorporated into photodefinable polymer compositions that encompass an antioxidant. Exemplary synergists include, but are not limited to, Irganox® PS 800 and Irganox® PS 802, both of which are available from Ciba Specialty Chemicals and have, respectively, the following CAS numbers and chemical names: CAS# 53571-83-8, dodecyl 3-(2-dodecoxycarbonylethylsulfanyl)propanoate; and CAS# 693-36-7, dioctadecyl 3,3'-thiodipropionate. It should be noted that synergist additives generally are employed in polymer compositions that encompass an antioxidant additive as such materials can enhance the effectiveness of the antioxidant additive. Essentially a synergistic relationship is found to exist between some antioxidant additives and some synergist additives.

It should be noted that amount of such antioxidants and synergists added to an exemplary polymer composition is, in pertinent part, a function of the structure of such materials as it should be recognized that their advantageous effects depends therefrom. For example, normalizing the phenolic content of Irganox 1076 to 1.0, the phenolic content of Irganox 129 and 1010 are found to be 2.5 and 2.0, respectively. Thus if the advantageous result of such antioxidants is soley based on relative phenolic content, twice as much Irganox 1076 as 1010 would be needed to achieve the same result. It should be realized, of course, that the phenolic content of a material is an indication of what might be expected and is not in itself the only factor that need be considered in determining an appropriate amount of antioxidant for a polymer composition. Generally, it has been found that antioxidant and synergist loading to such polymer compositions, where one or both are employed, ranges from 0.5 to 20 phr (parts per hundred) of the polymer.

In some embodiments, the photodefinable polymer composition encompasses a polymer prepared from at least two distinct types of norbornene-type monomers represented by Formula I above. Further descriptive of these embodiments is that one of such distinct types of norbornene-type monomers has at least one glycidyl ether functional pendant group, for example a glycidyl methyl ether pendant group, and another of such distinct types has at least one aralkyl pendant group, for example a phenethyl pendant group.

In other embodiments, the photodefinable polymer composition encompasses a polymer prepared from at least three distinct types of norbornene-type monomers of Formula I above. Further descriptive of these embodiments is that a first distinct type of norbornene-type monomer has at least one glycidyl ether functional pendant group, a second has at least one aralkyl pendant group, for example a phenethyl group, and a third has another pendent group that is chemically distinct from the pendent groups of the first and second types. For example, the pendent group of the third type of monomer has different atoms or different numbers or positions of atoms from the monomers of the first and second types described above.

In some embodiments, the photodefinable composition includes a polymer prepared by the polymerization of a reactor charge encompassing an appropriate mol % of each of the following three norbornene-type monomers, decylnorbornene, phenyl ethyl norbornene and glycidyl methyl ether norbornene with appropriate amounts of a material that photonically forms a catalyst such as Rhodorsil® PI 2074 (4-methylphenyl-4-(1 methylethyl)phenyliodonium tetrakis(pentafluorophenyl)borate) available from Rhodia; a sensitizer such as SpeedCure® CPTX 1-chloro-4-propoxy-9H-thioxanthone available from Lambson Group Inc.; a catalyst scavenger such as phenothiazine (Aldrich Chemical Company); an antioxidant such as Irganox® 1076 and/or Irganox® 1010 (both from Ciba Specialty Chemicals); a reactive diluents such as 1,4 dimethanolcyclohexane divinyl ether and an adhesion promoter such as 3-glycidoxypropyltrimethoxysilane. In other embodiments, one or more of the aforementioned exemplary synergists are used in such photodefineable polymer compositions.

Some embodiments in accordance with the present invention are directed to methods of forming a layer of a photodefinable composition on a substrate surface. Such embodiments include: providing a substrate, coating the substrate surface with the photodefinable polymer composition described above to form a layer, imagewise exposing the layer to appropriate actinic radiation, developing a pattern by removing unexposed portions of the layer and curing the remaining portions to form a patterned layer or pattern of structures on the surface.

For some embodiments, it is advantageous to pre-treat the substrate surface, just prior to the coating thereof, by exposing the substrate surface to a plasma discharge so that the adhesion of the polymer film to be formed thereon to the substrate surface is enhanced over a similar untreated surface. While it has been found that an oxygen plasma or an oxygen/argon plasma are both effective for treating a silicon substrate, a non-limiting example is exposing a surface of a silicon wafer substrate to an oxygen/argon plasma (50:50 percent by volume) for 30 seconds in a March RIE CS 1701 plasma generator at a power setting of 300 watts and a pressure of 300 mTorr, other appropriate gases or gas mixtures and other appropriate reactor conditions can be employed.

Any suitable method of coating may be used to coat the substrate with the photodefinable polymer composition. In an exemplary embodiment, suitable coating methods include, but are not limited to, spin coating, dip coating, brush coating, roller coating, spray coating, solution casting, fluidized bed deposition, extrusion coating, curtain coating, meniscus coating, screen or stencil printing and the like. In exemplary embodiments of the present invention, spin coating is typically employed for forming films of the aforementioned polymer compositions because of its simplicity and compatibility with current micro-electronic processing.

In some embodiments, after coating the substrate with a layer of photodefinable polymer, the layer is optionally first heated to a first temperature to remove essentially all of any residual solvents or other volatiles from the coated layer or film. Advantageously, such a first heating can also serve to relax any stress in the layer resulting from the coating process. Additionally, such heating can serve to harden the layer making it more durable than had no first heating been done. It is found that such first heating provides for more convenient handling during subsequent processing as well as a more uniform patterning of the layer.

Suitable conditions for such first heating include, but are not limited to, those sufficient for removing essentially all of any residual solvent from the layer while preventing such layer from undergoing any oxidative process or thermally initiated curing. While such first bake conditions will vary depending, in part, on the components of the polymer containing formulation, the following exemplary conditions are instructional. Such include, but are not limited to, appropriate times and temperatures from less than 1 minute to 30 minutes and from 75° C. to 150° C., respectively. In addition, suitable first heating conditions include heating in a vacuum, air or an inert gas atmosphere such as nitrogen, argon and helium.

The coated layer described above can be exposed using any suitable source of actinic radiation. In a non-limiting example, the actinic radiation is ultraviolet or visible radiation at a wavelength of from 200 nm to 700 nm, in some cases from 300 nm to 500 nm, and in other cases from 360 nm to 440 nm. In a further non-limiting example, the dose of such actinic radiation for exposing is from 50 mJ/cm$^2$ to 3,000 mJ/cm$^2$.

In some embodiments of the present invention, after coating the substrate with a layer of photodefinable polymer composition, and after the optional first heating (if employed), a photomask is placed between an actinic radiation source and the layer such that only selected portions of the layer are exposed to the actinic radiation. In those portions of the layer that are exposed to the radiation, the material that photonically forms a catalyst that initiates crosslinking of pendant epoxy groups incorporated in some of the repeat units of the polymer backbone, where such crosslinking converts the polymer material within the exposed portion to a generally solvent insoluble state. Non-exposed areas of the layer remain in their initial generally solvent soluble state thus allowing the use of a solvent (typically referred to as a developer) to readily remove the polymer material therein, resulting in the forming of a patterned layer or a pattern of structures disposed on the substrate.

After imagewise exposure, methods in accordance with the present invention incorporate a second heating. Such second heating is used to help complete crosslinking of pendant epoxy groups within exposed portions of the photodefinable layer, where the increased temperature of the second heating serves to increase mobility of the acid species formed by the exposure thus allowing such acid to find and react with remaining non-crosslinked epoxy groups to complete the crosslinking. It should be understood that complete crosslinking with the exposed portions maximizes the difference in the solubility between exposed and non-exposed portions. Thus, pattern definition is enhanced. In some embodiments of the invention, the second heating is to a temperature from 75° C. to no more than 140° C. for a period of time between 1 minutes and 20 minutes. In other embodiments second heating is to a temperature from 85° C. to 110° C. for a period of time between 4 minutes and 10 minutes. Further, second heating is typically conducted under an inert atmosphere (e.g., nitrogen, argon, or helium).

In some embodiments of the present invention, after the second heating, methods of forming a photodefinable layer on a substrate include developing a pattern therein or structures thereof are employed. Any suitable solvent developer may be used where such suitable developers are those that are able to remove soluble portions (e.g., non-crosslinked) of the layer. Such solvent developers include, but are not limited to, toluene, mesitylene, xylene, cyclopentanone, and 2-heptanone (MAK).

Further, any suitable method for developing the aforementioned patterned layer of structures can be employed. Such suitable methods include, but are not limited to, spray, puddle, and/or immersion developing techniques. Spray development includes spraying a polymer coated substrate with a continuous stream of atomized or otherwise dispersed stream of developing solvent for a period of time sufficient to remove the non-crosslinked polymer (non-exposed) from the substrate. The polymer coated substrate can be subjected to a final rinse with an appropriate solvent such as an alcohol. The puddle and immersion technique involves puddling developing solvent over the entire patterned coating or immersing the patterned coated substrate into developing solvent to dissolve the non-crosslinked polymer, and then rinsing the developed substrate in additional developing solvent or another appropriate solvent (e.g., an alcohol). In all of the foregoing development techniques, the developed coated substrate can be spun at high speed to remove residual solvent and solute.

After the above described developing, embodiments in accordance with the present invention are cured. In some embodiments, a two step curing cycle can be employed. For example, in a first curing cycle the developed polymer composition is heated to a first cure temperature from 150° C. to 200° C. for from 20 to 120 minutes, although shorter and/or longer times can be appropriate. Such first cure cycle is employed to remove any residual solvents from the developing, continue the crosslinking of the crosslinkable components and to provide an initial sidewall profile for the photodefined features and/or structures. In a subsequent second curing cycle, embodiments of the present invention are heated to a second cure temperature, higher than the first cure temperature. Such second cure temperature is generally from 200° C. to 290° C. where such heating is continued for from 20 to 120 minutes, where again shorter and/or longer times can be appropriate. The effect of this second cure cycle is believed to insure that the crosslinking of the crosslinkable components is essentially complete and thus providing that the desired mechanical, physical and chemical properties of the resultant film and/or structures, non-limiting examples of such being adhesion to the underlying substrate, low moisture uptake properties, low modulus and resistance to some chemicals and a second sidewall profile are achieved. It should be noted that for such photodefined embodiments, an initial sidewall profile of photodefined features of generally at or close to vertical (90°) is altered by the second heating to a second sidewall profile that is more sloped, less than vertical, than the initial sidewall profile. Such second profile is advantageously from 60° to 85°.

In other embodiments, photodefined polymer compositions are cured using a single curing cycle. That is to say that such embodiments are heated to a temperature from 200° C. to 290° C. for 50 to 180 minutes. Such single cure cycle has been shown effective for providing the aforementioned desirable properties and additionally provides an initial sidewall profile that is less than vertical and generally from 60° to 85°. It will be understood that the times and temperatures provided in discussing the cure cycles are broad ranges meant only as guidance for a skilled artisan. Thus any and all times and temperatures within the broad ranges provided are within the scope and spirit of the present invention.

When selected portions of the photodefinable layer have been exposed to actinic radiation and subsequently patterned and cured, the layer is in the form of a film or a plurality of structures covering at least a portion of a surface of the substrate. Generally, it is advantageous for the film and any resulting structures to have a desired thickness. As the processing of embodiments in accordance with the present invention can vary, and as this processing generally results in an initially applied thickness of a polymer composition disposed on a substrate being changed to a smaller, final thickness, it has been found that testing to determine the typical change in thickness allows for measuring the initial thickness as a means to obtain a desired final thickness. It will be noted that such testing, for example processing a layer of polymer composition disposed on a substrate through the entirety of the process, is well within the capability of a skilled artisan.

The desired final thickness can be any suitable thickness. That is to say any thickness that is appropriate for the specific microelectronic, electronic or opto-electronic application for which the film is to be used. Embodiments in accordance with the present invention generally have a final film thickness from 0.05 microns (t) to 100μ. In some embodiments such thickness is from 0.5μ to 50μ and in still others from 1 μ to 20μ. Finally, it should be noted that the final film thickness obtained can vary within any of the ranges of values provided or any combination of such ranges.

As a result of the various curing steps and as a result of the cumulative effect of the various curing steps, the crosslinking reaction is essentially completed and the resulting patterned film and/or structures have a glass transition temperature (Tg) that is characteristic of the actual composition employed and the actual processing of the composition. In some embodiments of the present invention, after the final cure step, the Tg is generally greater than 275° C.

While polymer compositions of the present invention are photodefinable by and through imagewise exposure and subsequent pattern development, in some embodiments it can be desirable to provide a non-imaged film. That is to say a layer or film that does not have a pattern formed therein or structures formed therefrom. Such non-imaged embodiments can be provided using the above described image development process where either the imagewise exposure is performed as a "blanket exposure" (all portions of the film are exposed to the actinic radiation) or where the film is not exposed at all to such actinic radiation. Where such a blanket exposure is employed, the image providing processes described above, without a developing step, will provide a fully cured film. Where no exposure to actinic radiation is used, the curing of the film will then be by only a thermal process. Thus an appropriate material that photonically forms a catalyst, i.e. a material that also thermally forms a catalyst, is included in the polymer composition and the curing temperatures and times adjusted, if found to be necessary, to fully cure the material. Suitable thermal acid generators include the onium salts, halogen containing compounds and sulfonates set forth above and suitable thermal curing agents or thermal acid generators include, but are not limited to, imidazoles, primary, secondary, and tertiary amines, quaternary ammonium salts, anhydrides, polysulfides, polymercaptans, phenols, carboxylic acids, polyamides, quaternary phosphonium salts, and combinations thereof. Finally, it should be noted that where a non-imaged film is prepared, such film can be patterned using any appropriate photolithographic imaging and patterning process. That is to say that a layer of a photoresist material can be disposed over a cured non-imaged layer, a pattern formed in the photoresist layer and the underlying non-imaged layer etched by any appropriate means.

The coated, patterned, developed, and cured films of the present invention have superior properties such as a low dielectric constant, low moisture absorption, toughness, craze resistance to solvents, and adhesion among other properties. Polymer films with at least some of these properties are useful in the fabrication of microelectronic devices where high-density packaging, interconnection, and fine features such as micro-vias are required.

Layers formed from photodefinable polymer compositions in accordance with the present invention and cured and patterned layers, films and structures made using the methods described herein, together with their associated substrates, are useful as components of electrical and/or electronic devices as well as a variety of optoelectronic devices that can benefit from the high temperature stability and/or other properties of such films, layers and structures that are formed. In some exemplary embodiments, the electrical and/or microelectronic devices are semiconductor devices. In other exemplary embodiments, the electrical or electronic devices are selected from, but not limited to, logic chips such as microprocessor chips, passive devices, a memory chips, microelectromechanical system (MEMS) chips, a microoptoelectromechanical system (MOEMS) chips and application specific integrated circuit (ASIC) chips. In still other exemplary embodiments, optoelectronic devices such as display devices, light emitting diodes and plasma devices are included.

As will be seen in the following examples, provided for illustrative purposes only, embodiments of the present invention provide for polymers that can be tailored to provide the specific properties and characteristics of a broad range of applications.

Polymer Synthesis Examples

Example 1

A polymer encompassing phenethyl, glycidyl methyl ether and decyl repeat units derived from phenethyl norbornene, glycidyl methyl ether norbornene and decyl norbornene was prepared as follows: To a reaction vessel dried at 110° C. for 18 hours and then transferred to a N2 purged glovebox, ethyl acetate (230 g), cyclohexane (230 g), phenethyl norbornene (14.17 g, 0.071 mol); glycidyl methyl ether norbornene (14.0 g, 0.100 mol) and decyl norbornene (39.50 g, 0.168 mol) were added. The reaction medium was purged of oxygen by passing a stream of dry N2 through the solution for 30 minutes. After the purging was completed, 1.50 g (3.10 mmol) of bis(toluene)bis(perfluorophenyl) nickel dissolved in 8 ml of toluene was injected into the reactor. The reaction mixture was stirred for 18 hours at ambient temperature and then treated with a peracetic acid solution (50 molar equivalents based on the nickel catalyst –150 mmol prepared by combining 57 ml of glacial acetic acid diluted with approximately 130 ml deionized water with 115 mL of 30 wt. % hydrogen peroxide diluted with approximately 100 ml deionized water) and stirred for an additional 18 hours.

Stopping the stirring allowed the aqueous and solvent layers to separate. The aqueous layer was then removed and the remaining solvent layer washed three times with 500 mL of distilled water by adding an aliquot of water, stirring for 20 minutes, allowing the layers to separate and then removing the aqueous layer. The washed solvent layer was then added to an excess of acetone to precipitate the polymer which was recovered by filtration and dried overnight at 60° C. in a vacuum oven. After drying, 66.1 g of dry polymer (92% conversion) was obtained. The molecular weight of the polymer was determined by GPC using a polystyrene standard and found to be Mw=105,138 Mn=46,439, the polydispersity (PDI) being 2.26. The composition of the polymer was determined using 1H NMR, and found to have incorporated: 20.2 mole percent (mol %) phenethyl norbornene; 29.1 mol % glycidyl methyl ether norbornene and 50.7 mol % decyl norbornene.

Example 2

The procedure of Example 1 was repeated, except that ethyl acetate (200 g), cyclohexane (200 g), phenethyl norbornene (5.06 g, 0.025 mol); glycidyl methyl ether norbornene (14.0 g, 0.077 mol) and decyl norbornene (33.6 g, 0.152 mol) were used. After the purging was completed, 1.45 g (3.00 mmol) of bis(toluene)bis(perfluorophenyl) nickel was dissolved in 8 ml of toluene and injected into the reactor. The reaction was stirred for 6 hours at ambient temperature and then treated with an appropriate peracetic acid solution and washed as in Example 1 above. The polymer was precipitated and recovered as in Example 1 above. After drying, 49.2 g of dry polymer (90% conversion) was obtained. The molecular weight of the polymer was determined by GPC using a polystyrene standard and found to be Mw=84,631, Mn=33,762, polydispersity index (PDI)=2.51. The composition of the polymer was determined using $^1$H NMR, and found to have incorporated: 10.2 mol % phenethyl norbornene; 31.5 mol % glycidyl methyl ether norbornene and 58.3 mol % decyl norbornene.

Example 3

The procedure of Example 1 was repeated, except that ethyl acetate (200 g), cyclohexane (200 g), phenethyl norbornene (2.36 g, 0.012 mol); glycidyl methyl ether norbornene (12.63 g, 0.070 mol) and decyl norbornene (35.6 g, 0.152 mol) were used. After the purging was completed, 1.33 g (2.74 mmol) of bis(toluene)bis(perfluorophenyl) nickel was dissolved in 7 ml of toluene and injected into the reactor. The reaction was stirred for 6 hours at ambient temperature and then treated with an appropriate peracetic acid solution and washed as in Example 1 above. The polymer was precipitated and recovered as in Example 1 above. After drying, 44.8 g of dry polymer (89% conversion) was obtained. The molecular weight of the polymer was determined by GPC using a polystyrene standard and found to be Mw=92,452 Mn=37,392, polydispersity index (PDI)=2.47. The composition of the polymer was determined using $^1$H NMR, and found to have incorporated: 6.5 mol % phenethyl norbornene; 30.1 mol % glycidyl methyl ether norbornene and 63.4 mol % decyl norbornene.

Example 4

The procedure of Example 1 was repeated, except that ethyl acetate (290 g), cyclohexane (290 g), phenethyl norbornene (71.85 g, 0.364 mol) and glycidyl methyl ether norbornene (28.15 g, 0.156 mol) were used. After the purging was completed, 3.15 g (6.51 mmol) of bis(toluene)bis(perfluorophenyl) nickel dissolved in 18.0 ml of toluene and injected into the reactor. The reaction was stirred for 18 hours at ambient temperature and then treated with peracetic acid solution (50 molar equivalents based on the nickel catalyst –150 mmol prepared by combining 100 ml of glacial acetic acid diluted with approximately 200 ml deionized water with 200 mL of 30 wt. % hydrogen peroxide diluted with approximately 200 ml deionized water) and stirred for an additional 18 hours.

Stopping the stirring allowed the aqueous and solvent layers to separate. The aqueous layer was then removed and the remaining solvent layer washed three times with 500 mL of distilled water by adding an aliquot of water, stirring for 20 minutes, allowing the layers to separate, and then removing the aqueous layer. The washed solvent layer was then added to an excess of methanol to precipitate the copolymer which was recovered by filtration and dried overnight at 60° C. in a vacuum oven. After drying, 93.0 of dry copolymer (93% conversion) was obtained. The molecular weight of the copolymer was determined by GPC using a polystyrene standard and found to be Mw=61,937 Mn=29,053, the polydispersity index (PDI) being 2.13. The composition of the copolymer was determined using $^1$H NMR, and found to have incorporated: 67.1 mol % phenethyl norbornene; 32.9 mol % glycidyl methyl ether norbornene.

Example 5

The procedure of Example 1 was repeated, except that ethyl acetate (917 g), cyclohexane (917 g), decyl norbornene (192 g, 0.82 mol) and glycidyl methyl ether norbornene (62 g, 0.35 mol) were used. After purging was completed, 9.36 g (19.5 mmol) of bis(toluene)bis(perfluorophenyl) nickel was dissolved in 15 ml of toluene and injected into the reactor. The reaction was stirred 5 hours at ambient temperature and then treated with an appropriate peracetic acid solution and washed as in Example 1 above. Stirring was stopped and water and solvent layers were allowed to separate. The polymer was then precipitated in methanol and recovered as in Example 1 above. After drying, 243 g of dry polymer (96% conversion) was recovered. The molecular weight of the polymer was determined by GPC using a polystyrene standard and found to be Mw=115,366 Mn=47,424, polydispersity index (PDI)=2.43. The composition of the polymer was determined using $^1$H NMR and found to have incorporated: 70 mol % decyl norbornene; and 30 mol % glycidyl methyl ether norbornene.

Example 6

A polymer encompassing phenethyl, glycidyl methyl ether and decyl repeat units derived from phenethyl norbornene, glycidyl methyl ether norbornene and decyl norbornene was prepared as follows: To a dried reaction vessel, ethyl acetate (603 g), cyclohexane (660 g), phenethyl norbornene (62.4 g, 0.315 mol); glycidyl methyl ether norbornene (85.0 g, 0.472 mol) and decyl norbornene (85.0 g, 0.787 mol) were charged. The charge was then purged of oxygen by heating to 40° C. and passing a stream of dry $N_2$ through the charge for 30 minutes. After the purging was completed, 6.36 g (0.013 mol) of bis(toluene)bis(perfluorophenyl) nickel dissolved in 57.20 g of ethyl acetate was injected into the reactor. The reaction mixture temperature was increased from 40° C. to 60° C. over a 10 minute period and stirred at this temperature for 3 hours. Then a peracetic acid solution (158 molar equivalents based on the nickel catalyst—prepared by combining 124.4 g of glacial acetic acid diluted with 117.5 g deionized water with 234.9 g of 30 wt. % hydrogen peroxide) was added to the reaction vessel and charge stirred for an additional 5 hours during which time the vessel was allowed to cool to 50° C. After 5 hours, 282 g of isopropanol was added, the stirring stopped and the aqueous and solvent layers were allowed to separate.

The aqueous layer was removed and the remaining solvent layer, containing the polymer, was washed three times with a mixture of 317.3 g deionized water and 136.0 g isopropanol by adding an aliquot, stirring for 5 minutes, allowing the layers to separate and then removing the aqueous layer. 238.8 g Isopropanol and 238.8 g methanol are added slowly to the polymer solution at 50° C. Then the resulting mixture was cooled to <30° C. and allowed to separate. The top layer top was decanted and 663.4 g of 2-heptanone and 325 g cyclohexane were added to the remaining layer and mixed. The resulting mixture was rotovapped under reduced pressure to remove residual solvents resulting in a final polymer solution in MAK of ~45-55%.

The molecular weight of the polymer was determined by GPC using a polystyrene standard and found to be Mw=71, 400 Mn=35,600, the polydispersity (PDI) being 2.0. Composition by $^1$H NMR was 19.6 mol % phenethyl norbornene, 29.7 mol % glycidyl methyl ether norbornene and 50.7 mol % decyl norbornene The epoxy number was 1.37 mmol/g.

FORMULATION AND PROCESS EXAMPLES

Example A

An amber wide neck bottle was charged with 101.0 g of a polymer solution prepared as in Example 5 and 50 g of 2-heptanone (MAK). The solution was mixed until the solid polymer was completely dissolved and then filtered through a 0.45 micron filter to remove particles. To the solution was added 2.00 g (1.97 mmol) of Rhodorsil® 2074 photoinitiator, 0.60 g (1.97 mmol) of Speedcure® CTPX (Lambson Group Ltd.) 0.137 g (0.688 mmol) phenothiazine (Aldrich) and 2.657 g of Irganox 1076 (5.00 mmol). The solution is mixed for 18 hours to completely disperse the photoactive compounds.

A 5 inch oxynitride coated silicon wafer is spin coated with 4.0 g of the polymer solution. The resulting coating is first baked at 120° C. on a hot plate for 4 minutes. The film is patterned by imagewise exposing to 300 mJ/cm² of UV radiation (365 nm). The resulting pattern in the polymer film is enhanced by second heating the wafer in a nitrogen oven at 90° C. for 5 minutes. The pattern is developed in a spin developer by spraying the film with cyclopentanone for 120 seconds to dissolve the unexposed regions of the film. The wet film is then rinsed with propylene glycol monomethyl ether acetate (PGMEA) for 30 seconds and cured for 60 minutes at 250° C. under a nitrogen atmosphere.

Example B

An amber wide neck bottle was charged with 191.25 g of a polymer material prepared as in Example 1 and 191 g of 2-heptanone (MAK). The solution was mixed until the solid polymer was completely dissolved and then filtered through a 0.45 micron filter to remove particles. To the solution was added 3.825 g (3.77 mmol) of Rhodorsil® 2074 photoinitiator, 1.148 g (3.77 mmol) of Speedcure® CTPX (Lambson Group Ltd.), 0.262 g (1.32 mmol) phenothiazine (Aldrich) and 3.73 g (7.03 mmol) of Irganox 1076 (Ciba). The solution is mixed for 18 hours to completely disperse the photoactive compounds.

A 5 inch oxynitride coated silicon wafer is spin coated with 4.0 g of the polymer solution above and processed as described in Example A to form an imaged polymer layer.

Example C

An amber wide neck bottle was charged with 37.5 g of a polymer material prepared as in Example 1 and 37.5 g of 2-heptanone (MAK). The solution was mixed until the solid polymer was completely dissolved and then filtered through a 0.45 micron filter to remove particles. To the solution was added 0.9840 g (0.97 mmol) of Rhodorsil® 2074 photoinitiator, 0.297 g (0.97 mmol) of Speedcure® CTPX (Lambson Group Ltd.), 0.070 g (0.35 mmol) phenothiazine (Aldrich), 0.73 g (1.38 mmol) of Irganox 1076 (Ciba Specialty Chemicals), 2.46 g (10.4 mmol) 3-glycidoxylpropyl trimethoxysilane (Aldrich), and 1.25 g (6.36 mmol) 1,4-cyclohexane dimethanol divinyl ether. The solution is mixed for 18 hours to completely disperse the photoactive compounds.

A 5 inch oxynitride coated silicon wafer is spin coated with 4.0 g of the polymer solution above and processed as described in Example A to form an imaged polymer layer.

Example D

An amber wide neck bottle was charged with 33.2 g of a polymer material prepared as in Example 4 and 47.6 g of 2-heptanone (MAK). The solution was mixed until the solid polymer was completely dissolved and then filtered through a 0.45 micron filter to remove particles. To the solution was added 0.66 g (0.65 mmol) of Rhodorsil® 2074 photoinitiator, 0.20 g (0.668 mmol) of Speedcure® CTPX (Lambson Group Ltd.) 0.051 g (0.256 mmol) of phenothiazine (Aldrich), 0.50 g of Irganox 1076 (0.939 mmol), 1.67 g (7.2 mmol) of 3-glycidoxylpropyl trimethoxysilane (Aldrich), and 0.831 g (4.23 mmol) 1,4-cyclohexane dimethanol divinyl ether. The solution was mixed for 18 hours to completely disperse the photoactive compounds.

A 5 inch oxynitride coated silicon wafer is spin coated with 4.0 g of the polymer solution above and processed as described in Example A to form an imaged polymer layer except that the first bake was at 110° C. and the exposure energy was at 400 mJ/cm²

Example E

A 500 mL beaker was charged with 2.57 g (2.53 mmol) of Rhodorsil® 2074 photoinitiator, 0.55 g (1.81 mmol) of Speedcure® CTPX (Lambson Group Ltd.), 0.16 g (0.82 mmol) phenothiazine (Aldrich), 9.91 g (7.8 mmol) of Irganox 1010 (Ciba Specialty Chemicals), 4. 60 g (23.4 mmol) 1,4-cyclohexanedimethanol divinyl ether, 9.19 g (38.8 mmol) 3-glycidoxylpropyl trimethoxysilane (KBM-403E, Shin Etsu), and 4.60 g (11.7 mmol) Si-75 (Evonik). 2-Heptanone (MAK) 59.4 g was added to the beaker along with a magnetic stir bar and the mixture was stirred at ambient temperature for 60 minutes in order to dissolve the photoactive compounds and produce a homogeneous solution. The solution was then added to an amber wide neck bottle previously charged with 200 g of a polymer solution prepared as in Example 1. The polymer and additive solution was mixed for 18 hours to completely disperse the photoactive compounds, afterwhich it was filtered through a 0.45 micron filter to remove any particles.

A 5 inch silicon dioxide coated silicon wafer was spin coated with 4.0 g of the above polymer composition and processed as described in Example A to form an imaged polymer layer.

The rations of the above additives to polyer were as follows, Rhodorsil 2.8 phr, CPTX 0.6 phr, Irganox 1010 10 phr, Phenothiazine 0.18, CHDVE 5 phr, KBM-403E 5 phr and Si-75 5 phr.

Example F

A 500 mL beaker was charged with 6.97 g (6.86 mmol) of Rhodorsil® 2074 photoinitiator, 2.09 g (6.86 mmol) of Speedeure® CTPX (Lambson Group Ltd.), 0.48 g (2.39 mmol) phenothiazine (Aldrich), 5.23 g (9.84 mmol) of Irganox 1076 (Ciba Specialty Chemicals), 17.42 g (73.7 mmol) of 3-glycidoxylpropyl trimethoxysilane (KBM-403E, Shin Etsu), and 8.71 g (44.4 mmol) 1,4-cyclohexanedimethanol divinyl ether. 2-Heptanone (MAK) 325.1 g was added to the beaker along with a magnetic stir bar and the mixture processed as described in Example E through filtration and wafer coating.

Examples G-J

In the manner of Example F, formulations G, H, and J where prepared using a polymer prepared in the manner any of Examples 1-6 where the relative molar ratios of the repeat units of the polymer was 3:4:3 (decyl NB: PENB: GME NB). Each formulation encompassed essentially 43 Weight % of the polymer in MAK and the amount of each additive, indicated in FIG. 1, to form polymer compositions G, H, and J. Once formed, each composition was applied to a substrate in the manner of Example F and subjected to 100 hrs of oxidative stress testing in air at 150° C. After such testing was completed, the C=O absorbance of each composition was measured at 1730 cm$^{-1}$. FIG. 2 depicts the result of such absorbance measurement.

It should be noted that increased absorbance is indicative of increased oxidative instability. Thus Examples H and G having the highest absorbance are the most unstable compositions while Example and J have lower absorbance indicating greater stability. Examining the different additives provided to each formulation, it can be seen that where the adhesion promoter Si-75 is provided the stability is greater than when it is not. Thus it can been said that Si-75 enhances the antioxidation effect of each of Irganox 1010 and 1076. Said another way, Si-75 seems to act as both an adhesion promoter and a synergist. Such an effect is unexpected.

It will be appreciated by those skilled in the art that changes could be made to the embodiments described above without departing from the broad inventive concept thereof. It is understood, therefore, that this invention is not limited to the particular embodiments disclosed, but it is intended to cover modifications that are within the spirit and scope of the invention, as defined by the appended claims.

Therefore we claim:

1. A vinyl addition polymer comprising a backbone having at least three distinct types of repeat units derived from norbornene-type monomers, such monomers being independently selected from monomers represented by Formula I:

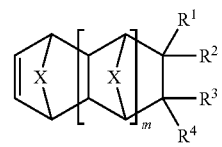

(I)

where X is selected from —$CH_2$—, —$CH_2$—$CH_2$— and —O—; m is an integer from 0 to 5; and each occurrence of $R^1$, $R^2$, $R^3$, and $R^4$ is independently selected from one of the following groups:

H, $C_1$ to $C_{25}$ linear, branched, and cyclic alkyl, aryl, aralkyl, alkenyl, and alkynyl; or $C_1$ to $C_{25}$ linear, branched, and cyclic alkyl, aryl, aralkyl, alkenyl, and alkynyl containing one or more hetero atoms selected from O, N, and Si; or a glycidyl ether containing group represented by Formula II:

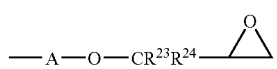

(II)

wherein A is a linking group selected from $C_1$ to $C_6$ linear, branched, and cyclic alkylene and $R^{23}$ and $R^{24}$ are each independently selected from H, methyl, and ethyl; or any combination of two of $R^1$, $R^2$, $R^3$, and $R^4$ linked together by a linking group selected from $C_1$ to $C_{25}$ linear, branched, and cyclic alkylene and alkylene aryl; and with the proviso that a first monomer of the at least three distinct types of monomers represented by Formula I comprises at least one glycidyl ether pendant group, a second monomer of the at least three distinct types of monomers comprises at least one aralkyl pendant group and a third monomer of the at least three distinct types of monomers comprises at least one alkyl pendant group.

2. The polymer of claim 1, where for a first type of repeat unit X is —$CH_2$—, m is zero, and at least one of $R^1$, $R^2$, $R^3$ and $R^4$ is a glycidyl ether containing group of Formula II in which A is methylene and $R^{23}$ and $R^{24}$ are each H, and the others of $R^1$, $R^2$, $R^3$ and $R^4$ are H.

3. The polymer of claim 1, where for a second type of repeat unit X is —$CH_2$—, m is zero, and at least one of $R^1$, $R^2$, $R^3$ and $R^4$ is a phenethyl group and the others of $R^1$, $R^2$, $R^3$ and $R^4$ are H.

4. The polymer of claim 1, 2 or 3, where for a third type of repeat unit X is —$CH_2$—, m is zero, and at least one of $R^1$, $R^2$, $R^3$ and $R^4$ is an n-decyl group and the others of $R^1$, $R^2$, $R^3$ and $R^4$ are H.

5. The polymer of claim 1, where X is —$CH_2$—, m is zero, and for a first type of repeat unit at least one of $R^1$, $R^2$, $R^3$ and $R^4$ is a glycidyl ether containing group of Formula II in which A is methylene and $R^{23}$ and $R^{24}$ are each H, and the others of $R^1$, $R^2$, $R^3$ and $R^4$ are H, and for a second type of repeat unit at least one of $R^1$, $R^2$, $R^3$ and $R^4$ is a phenethyl group and the others of $R^1$, $R^2$, $R^3$ and $R^4$ are H, and for a third type of repeat unit at least one of $R^1$, $R^2$, $R^3$ and $R^4$ is an n-decyl group and the others of $R^1$, $R^2$, $R^3$ and $R^4$ are H.

6. The polymer of claim 5, wherein the amount of the first type of repeat units is from 25 to 35 mole percent, the amount of the second type of repeat units is from 15 to 25 mole percent and the amount of the third type of repeat units is from 40 to 60 mole percent, on a basis of total mole percent of the monomers from which the repeat units of the vinyl addition polymer are formed.

7. The polymer of claim 5, wherein the amount of the first type of repeat units ranges from 10 to 50 mole percent, the amount of the second type of repeat units ranges from 5 to 60 mole percent, and the amount of the third type of repeat units ranges from 10 to 50 mole percent, on a basis of total mole percent of the monomers from which the repeat units of the vinyl addition polymer are formed.

8. The polymer of claim 5, wherein the amount of the first type of repeat units is from 25 to 35 mole percent, the amount of the second type of repeat units is from 35 to 45 mole percent and the amount of the third type of repeat units is from 45 to 55 mole percent, on a basis of total mole percent of the monomers from which the repeat units of the vinyl addition polymer are formed.

9. The polymer of claim 1 or 5, wherein the weight average molecular weight of the polymer ranges from 10,000 to 500,000 as determined by gel permeation chromatography using poly(styrene) standards.

10. The polymer of claim 1 or 5, wherein the polymer has a glass transition temperature of at least 275° C.

11. The polymer of claim 1 or 5, wherein the polymer has a moisture absorption of less than 2 weight percent and a dielectric constant of less than 3.9.

12. The polymer of claim 1 or 5, wherein the polymer has a modulus of from 0.1 GPa to 3 GPa.

13. The polymer of claim 1 or 5, further comprising a solvent selected from the group consisting of hydrocarbon solvents, aromatic solvents, cycloaliphatic cyclic ethers, cyclic ethers, acetates, esters, lactones, ketones, amides, aliphatic mono-vinyl ethers, aliphatic multi-vinyl ethers, cycloaliphatic mono-vinyl ethers, cycloaliphatic multi-vinyl ethers, aromatic mono-vinyl ethers, aromatic multi-vinyl ethers, cyclic carbonates and mixtures thereof.

14. The polymer of claim 13, wherein the solvent is selected from the group consisting of cyclohexane, benzene, toluene, xylene, mesitylene, tetrahydrofuran, anisole, terpenoids, cyclohexene oxide, .alpha.-pinene oxide, 2,2'-[methylenebis(4,1-phenyleneoxymethylene)]bis-oxirane, 1,4-cyclohexanedimethanol divinyl ether, bis(4-vinyloxyphenyl) methane, cyclohexanone.

15. A photodefinable polymer composition comprising a polymer according to claim 1 or 5 and a material that photonically forms a catalyst.

16. The photodefinable polymer composition of claim 15, where the material that photonically forms a catalyst is a photoacid generator.

17. The photodefinable polymer composition of claim 16, where the photoacid generator comprises one or more compounds selected from the group consisting of onium salts, halogen-containing compounds, and sulfonates.

18. The photodefinable polymer composition of claim 16, where the photoacid generator is selected from the group consisting of 4,4'-ditertiarybutylphenyl iodonium triflate, 4,4',4"-tris(tertiary butylphenyl)sulphonium triflate, diphenyliodonium tetrakis(pentafluorophenyl)sulphonium borate, triarylsulphonium-tetrakis(pentafluorophenyl)-borate, triphenylsulfonium tetrakis(pentafluorophenyl)sulphonium borate, 4,4'-ditertiarybutylphenyl iodonium tetrakis(pentafluorophenyl) borate, tris(tertiary butylphenyl)sulphonium tetrakis(pentafluorophenyl) borate, (4-methylphenyl-4-(1-methylethyl)phenyl iodonium tetrakis(pentafluorophen-yl) borate and mixtures thereof.

19. The photodefinable polymer composition of claim 16, where the photoacid generator is present in an amount from 0.1 to 10 percent by weight of the composition.

20. The photodefinable polymer composition of claim 16, further comprising one or more components selected from the group consisting of one or more sensitizer components, one or more solvents, one or more catalyst scavengers, one or more adhesion promoters, one or more antioxidants, one or more fire retardants, one or more stabilizers, one or more reactive diluents and one or more plasticizers.

21. The photodefinable polymer composition of claim 20, where the sensitizer component is selected from the group consisting of anthracenes, phenanthrenes, chrysenes, benzpyrenes, fluoranthenes, rubrenes, pyrenes, xanthones, indanthrenes, thioxanthen-9-ones and mixtures thereof.

22. The photodefinable polymer composition of claim 20, where the sensitizer component is selected from the group consisting of 2-isopropyl-9H-thioxanthen-9-one, 4-isopropyl-9H-thioxanthen-9-one, 1-chloro-4-propoxythioxanthone, phenothiazine and mixtures thereof.

23. The photodefinable polymer composition of claim 20, where the catalyst scavenger is an acid scavenger.

24. The photodefinable polymer composition of claim 23, wherein the acid scavenger component is selected from one or more secondary amines and tertiary amines.

25. The photodefinable polymer composition of claim 23, wherein the acid scavenger component is selected from the group consisting of pyridine, phenothiazine, tri(n-propyl amine), triethylamine, lutidine in any of its isomeric forms and mixtures thereof.

26. The photodefinable polymer composition of claim 20, where the antioxidant is selected from the group consisting of octadecyl 3,5-di-(tert)-butyl-4-hydroxyhydrocinnamate, pentaerythritol tetrakis(3-(3,5-di-tert-butyl-4-hydroxyphenyl)propionate), tris(2,4-ditert-butylphenyl) phosphite and mixtures thereof.

27. The photodefinable polymer composition of claim 20, where the adhesion promoter is selected from the group consisting of (bis(3,3'-triethoxysilylpropyl)disulfide, 3-glycidoxypropyltrimethoxysilane, bis(3-triethoxysilylpropyl)disulfide and mixtures thereof.

28. An electrical or electronic device comprising a layer formed from the photodefinable polymer composition of claim 15.

29. The electrical or electronic device of claim 28, where the device is a semiconductor device or a semiconductor device package.

30. The electrical or electronic device according to claim 28, where the device is selected from a logic chip, a passive device, a memory chip, a microelectromechanical system (MEMS) chip, a microoptoelectromechanical systems (MOEMS) chip, and an application specific integrated circuit (ASIC) chip.

31. A method of forming a dielectric structure on a substrate, comprising:
   providing a substrate;
   plasma treating the substrate;
   coating at least a portion of one side of the plasma treated substrate with a layer a of a polymer composition comprising the polymer of claim 5, 4-methylphenyl-4-(1 methylethyl)phenyliodonium tetrakis(pentafluorophenyl) borate; 1-chloro-4-propoxy-9H-thioxanthone, phenothiazine, 1,4-dimethanolcyclohexane divinyl ether, 3-glycidoxypropyltrimethoxysilane and 3,5-di-tert-butyl-4-hydroxyhydrocinnamate;

first heating the layer;

imagewise exposing the layer to actinic radiation, such imagewise exposing forming exposed portions of the layer and unexposed portions of the layer;

second heating the radiation-exposed layer;

treating the radiation-exposed layer with a developer solution, such treating removing said unexposed portions and not removing said exposed portions; and curing said exposed portions.

32. A method of forming a dielectric structure on a substrate, comprising:

providing a substrate;

plasma treating the substrate;

coating at least a portion of one side of the plasma treated substrate with a layer of a polymer composition comprising the polymer of claim 5, 4-methylphenyl-4-(1 methylethyl)phenyliodonium tetrakis(pentafluorophenyl) borate; 1-chloro-4-propoxy-9H-thioxanthone; phenothiazine, 1,4-dimethanolcyclohexane divinyl ether, 3-glycidoxypropyltrimethoxysilane, bis(3-triethoxysilylpropyl) disulfide and pentaerythritol tetrakis{3-(3,5-di-t-butyl-4-hydroxyphenyl)propionate};

first heating the layer;

imagewise exposing the layer to actinic radiation, such imagewise exposing forming exposed portions of the layer and unexposed portions of the layer;

second heating the radiation-exposed layer;

treating the radiation-exposed layer with a developer solution, such treating removing said unexposed portions and not removing said exposed portions; and curing said exposed portions.

33. The method of claim 31 or 32, where plasma treating the substrate comprises exposing the substrate to an oxygen plasma at a pressure of 300 mTorr for 30 seconds.

34. The method of claim 31 or 32, where plasma treating the substrate comprises exposing the substrate to an oxygen:argon plasma (1:1 ratio of gas volume) at a pressure of 300 mTorr for 30 seconds.

35. The method of claim 31 or 32, where first heating the layer comprises heating the substrate to from 100° C. to 130° C. for from less than a minute to 20 minutes.

36. The method of claim 31 or 32, where imagewise exposing comprises exposing selected portions of such layer to actinic radiation having an energy of from 50 to 3000 mJ/cm$^2$ at a wavelength of 365 nm.

37. The method of claim 31 or 32, where second heating the imagewise exposed layer comprises heating such layer to from 90° C. to 120° C. for from 1 to 10 minutes.

38. The method of claim 31 or 32, where treating the radiation-exposed layer with a developer solution comprises developing the layer with cyclopentanone, MAK or other developer solvent by bath immersion with agitation for from 1 to 10 minutes followed by a bath immersion with agitation in isopropyl alcohol, PGMEA or other solvent to rinse and dry.

39. The method of claim 31 or 32, wherein the step of treating the radiation-exposed layer with a developer solution comprises developing the layer with cyclopentanone, MAK or other developer solvent by spray develop for from 0.1 to 10 minutes followed by a spray rinse with isopropyl alcohol, PGMEA or other solvent to rinse and spin dry.

40. The method of claim 31 or 32, where curing the exposed portions of the imagewise exposed layer comprises:

third heating the layer in a nitrogen atmosphere to a temperature of from 160° C. to 200° C. for from 20 to 120 minutes; and fourth heating the layer in a nitrogen atmosphere to a temperature of from 200° C. to 290° C. for from 20 to 120 minutes.

41. The method of claim 31 or 32, where curing the exposed portions of the imagewise exposed layer comprises curing the layer in a single step by heating the layer in a nitrogen atmosphere to a temperature from 160° C. to 290° C. for a period of time from 20 to 120 minutes.

42. An electrical or electronic device comprising a layer formed from the photodefinable polymer composition of claim 27.

* * * * *